(12) United States Patent
Park et al.

(10) Patent No.: US 7,588,983 B2
(45) Date of Patent: Sep. 15, 2009

(54) EEPROM CELL AND EEPROM DEVICE WITH HIGH INTEGRATION AND LOW SOURCE RESISTANCE AND METHOD OF MANUFACTURING THE SAME

(75) Inventors: Weon-ho Park, Suwon-si (KR); Byoung-ho Kim, Suwon-si (KR); Hyun-khe Yoon, Suwon-si (KR); Seung-beom Yoon, Suwon-si (KR); Sung-chul Park, Seoul (KR); Ju-ri Kim, Seoul (KR); Kwang-Tae Kim, Yongin-si (KR); Jeong-wook Han, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/012,593

(22) Filed: Feb. 4, 2008

(65) Prior Publication Data
US 2008/0132014 A1      Jun. 5, 2008

Related U.S. Application Data

(62) Division of application No. 10/997,835, filed on Nov. 24, 2004, now Pat. No. 7,352,026.

(30) Foreign Application Priority Data
Nov. 28, 2003    (KR) ................................ 2003-85766

(51) Int. Cl.
*H01L 21/336* (2006.01)
*H01L 21/8238* (2006.01)
(52) U.S. Cl. .................. 438/257; 438/201; 438/264; 438/266
(58) Field of Classification Search ............... 438/201, 438/211, 257, 263, 264, 266; 257/295, 298, 257/314–326, E21.422, E21.68, E21.681, 257/E21.683, E21.468, E21.69, E21.691
See application file for complete search history.

(56) References Cited

U.S. PATENT DOCUMENTS

| | | | |
|---|---|---|---|
| 5,063,423 A | 11/1991 | Fujii et al. | |
| 5,079,603 A | 1/1992 | Komori et al. | |
| 5,189,497 A | 2/1993 | Komori et al. | |
| 5,877,980 A | 3/1999 | Mang et al. | |
| 5,894,147 A | 4/1999 | Cacharelis | |

(Continued)

FOREIGN PATENT DOCUMENTS

| | | |
|---|---|---|
| JP | 2002-231832 | 8/2002 |
| KR | 1999-0031224 | 5/1999 |

*Primary Examiner*—Hung Vu
(74) *Attorney, Agent, or Firm*—Mills & Onello LLP

(57) ABSTRACT

Provided are an EEPROM cell, an EEPROM device, and methods of manufacturing the EEPROM cell and the EEPROM device. The EEPROM cell is formed on a substrate including a first region and a second region. A first EEPROM device having a first select transistor and a first memory transistor is disposed in the first region, while a second EEPROM device having a second select transistor and a second memory transistor is disposed in the second region. In the first region, a first drain region and a second floating region are formed apart from each other. In the second region, a second drain region and a second floating region are formed apart from each other. A first impurity region, a second impurity region, and a third impurity region are disposed in a common source region between the first and second regions of the substrate. The first and third impurity regions form a DDD structure, and the first and second impurity region form an LDD structure. That is, the first impurity region completely surrounds the second and third impurity regions in horizontal and vertical directions, the second impurity region surrounds the third impurity region in a horizontal direction, and the junction depth of the third impurity is greater than that of the second impurity region.

13 Claims, 19 Drawing Sheets

U.S. PATENT DOCUMENTS

| | | |
|---|---|---|
| 6,207,991 B1 | 3/2001 | Rahim |
| 6,555,869 B2 | 4/2003 | Park |
| 6,617,632 B2 | 9/2003 | Taniguchi et al. |
| 6,900,086 B2 | 5/2005 | Mori et al. |
| 6,979,856 B2 * | 12/2005 | Nishizaka et al. ........... 257/314 |
| 7,009,242 B2 | 3/2006 | Nagai |
| 2001/0054735 A1 | 12/2001 | Nagai |
| 2002/0105020 A1 | 8/2002 | Park |
| 2003/0142541 A1 | 7/2003 | Shum et al. |
| 2003/0203605 A1 | 10/2003 | Mori et al. |

* cited by examiner n-TYPE IMPUNITY IONS

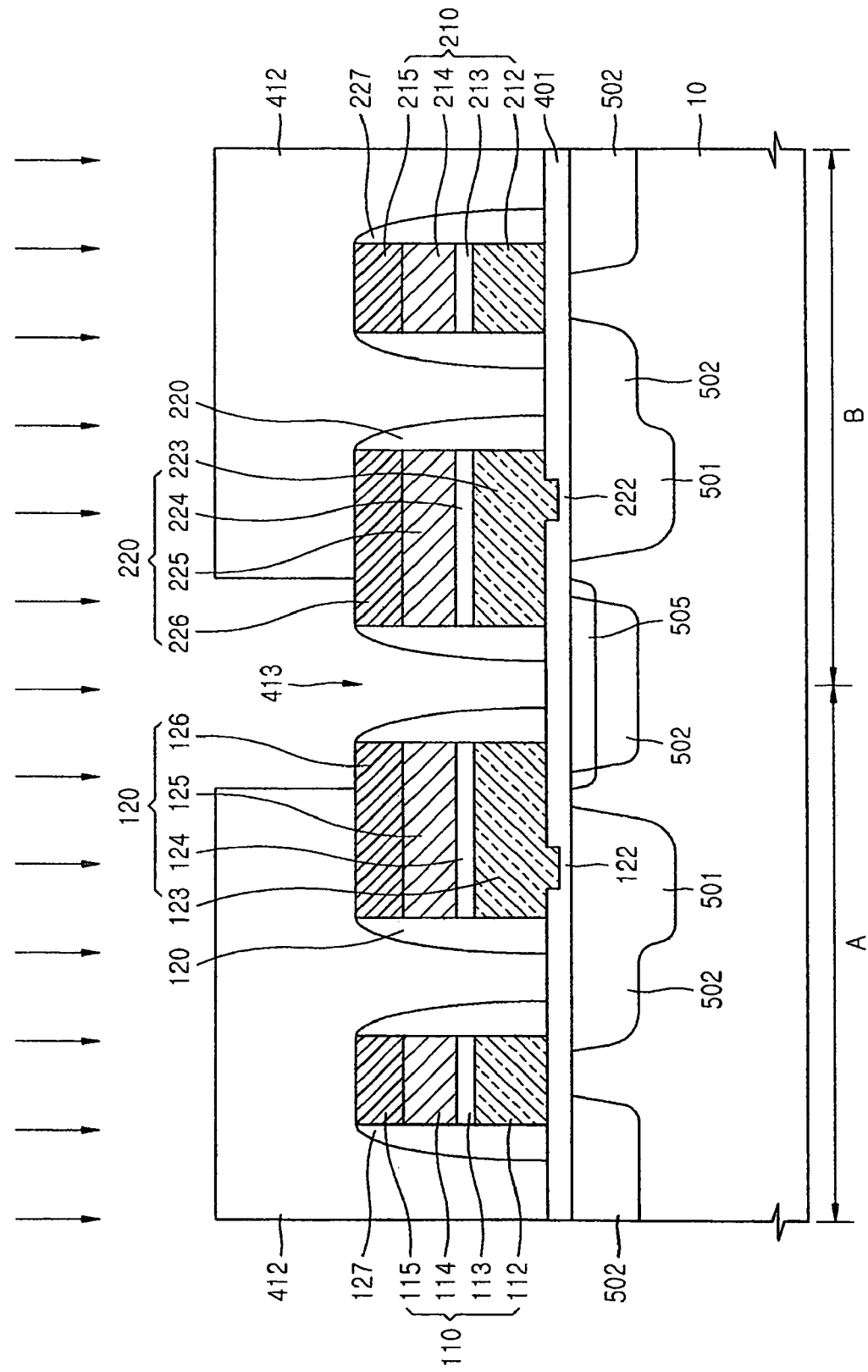

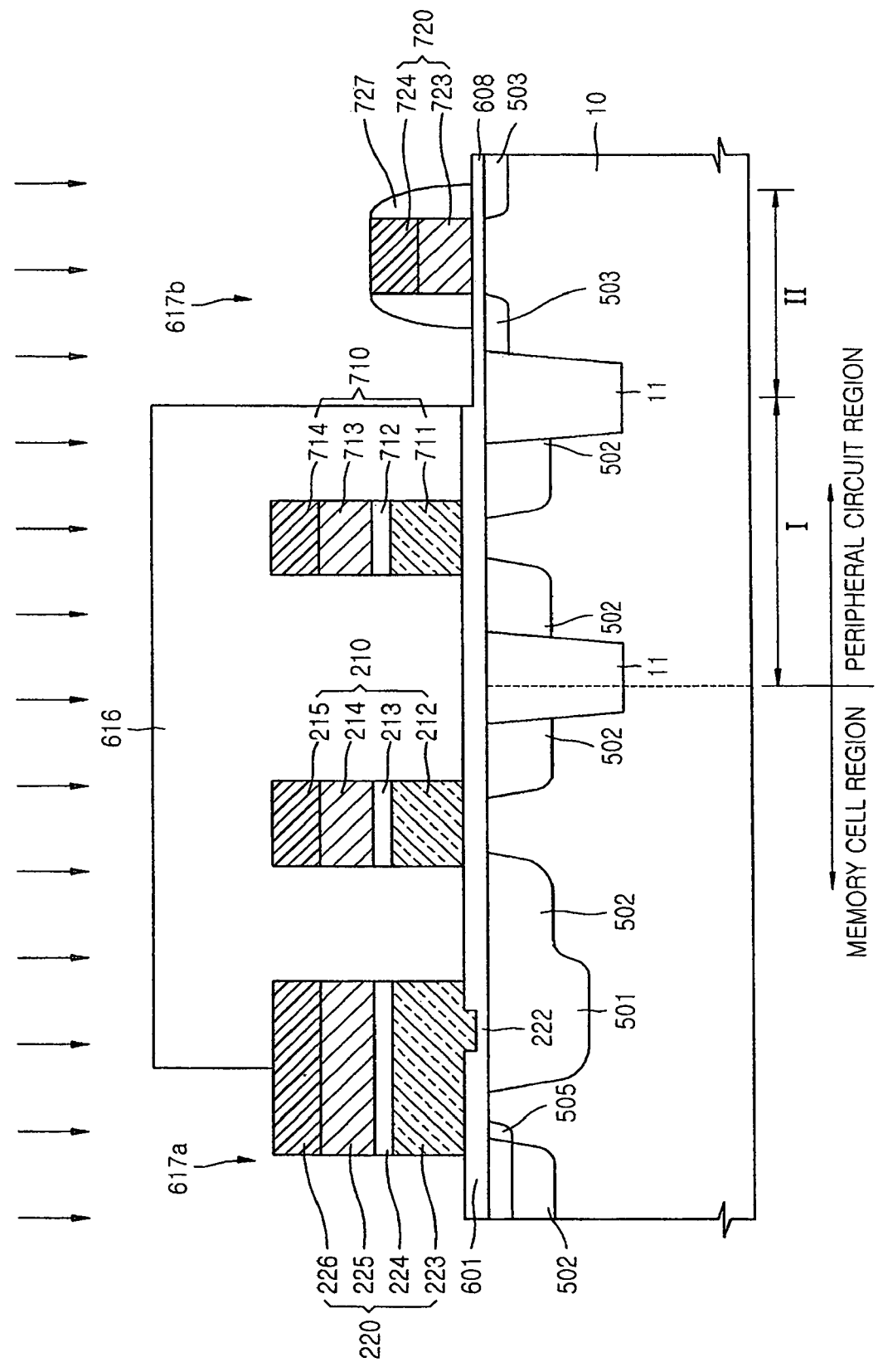

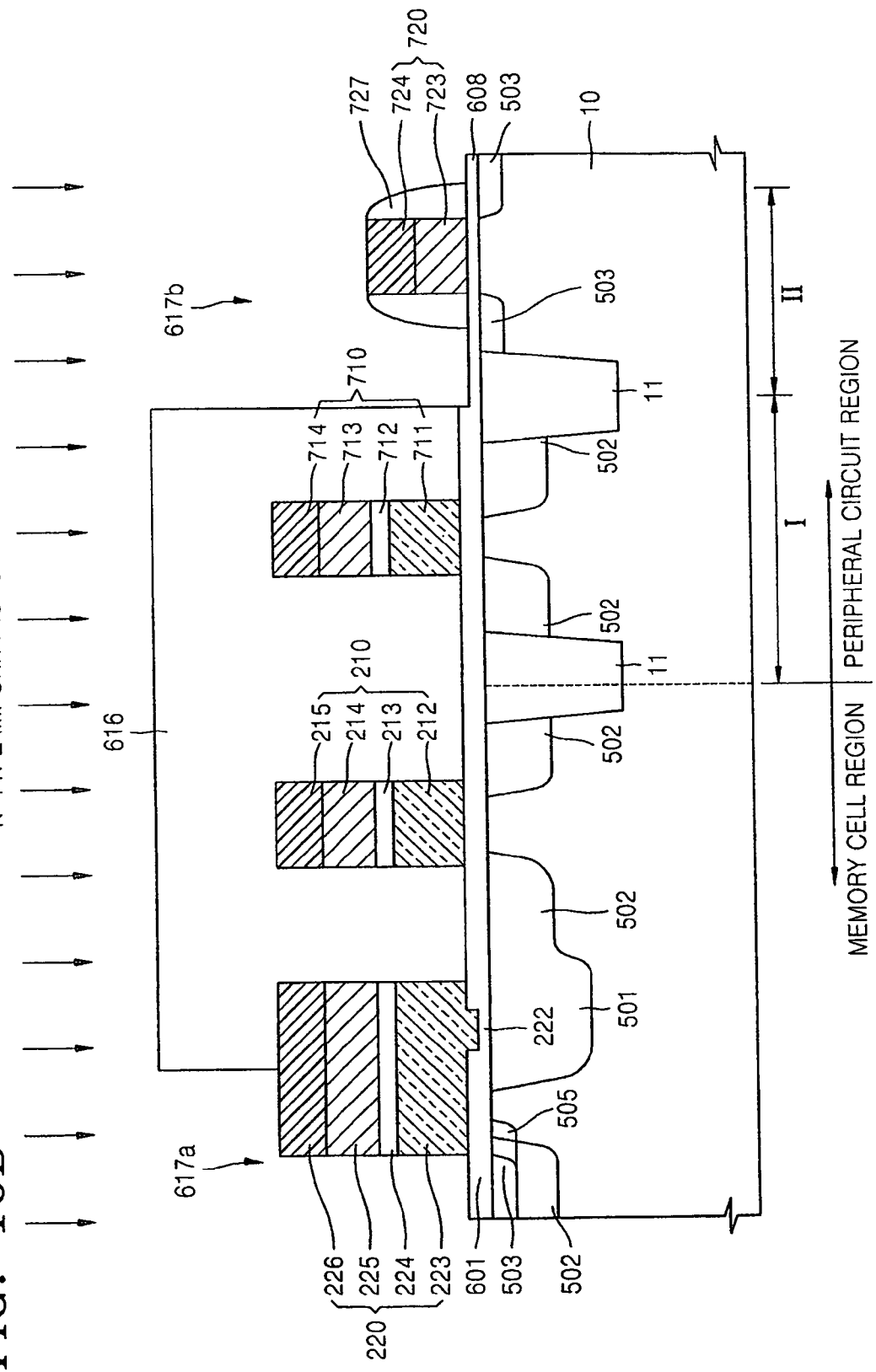

EEPROM CELL AND EEPROM DEVICE WITH HIGH INTEGRATION AND LOW SOURCE RESISTANCE AND METHOD OF MANUFACTURING THE SAME

This application is a divisional application of U.S. application Ser. No. 10/997,835, filed Nov. 24, 2004, which claims the priority of Korean Patent Application No. 2003-85766, filed on Nov. 28, 2003, in the Korean Intellectual Property Office, the contents of which are incorporated herein in their entirety by reference.

BACKGROUND OF THE INVENTION

1. Field of the Invention

The present invention relates to a semiconductor memory cell, a semiconductor memory device, and a method of manufacturing the same, and more particularly, to an electrically erasable and programmable read only memory (EEPROM) cell and an EEPROM device, which have high integration and low source resistance, and a method of manufacturing the same.

2. Description of the Related Art

An EEPROM device is a nonvolatile memory device, which retains stored data even if a power supply is interrupted. The EEPROM device includes a select transistor and a memory transistor, and an EEPROM cell typically includes two EEPROM devices. A pair of EEPROM devices included in a single EEPROM cell has a common source structure in which the EEPROM devices have a single source region in common. In recent years, as the capacitance of a cell memory increases and the demand for high integration is increased, cell size is reduced to produce highly integrated EEPROM devices. However, with the downscaling of cells, the channel length also decreases, thus resulting in some problems such as a short channel effect.

In a conventional EEPROM device, a lightly doped drain (LDD) is typically used as a common source region. However, in an EEPROM that employs an LDD type common source region, the channel length is short with the downscaling of an EEPROM cell, and punch-through occurs in the channel, thereby degrading the stability of the device. In order to prevent punch-through in a channel of an EEPROM device with the LDD type common source region, impurity ions (e.g., boron ions) should be implanted into the device, but this process increases the threshold voltage of the device.

To solve these problems, a method of using a common source region of a double diffused drain (DDD) type in place of the LDD type is proposed. An EEPROM device with a DDD type common source region is structured such that a heavily doped source region is totally surrounded by a lightly doped source region, which has a lower dopant concentration than a lightly doped source region of an LDD type common source region. Thus, even if there is no additional implantation of boron ions, punch-through rarely occurs. However, since the dopant concentration of the lightly doped source region is relatively low, source resistance is increased. The source resistance is further increased in a structure with a long carrier moving path, such as the common source structure. As a result, the electric characteristics of the EEPROM device are degraded.

SUMMARY OF THE INVENTION

The present invention provides an electrically erasable and programmable read only memory (EEPROM) cell and an EEPROM device which have high integration and low source resistance.

The present invention provides a method of manufacturing the EEPROM cell and the EEPROM device.

According to an aspect of the present invention, there is provided an EEPROM cell, which includes a substrate including a first region, in which a first EEPROM device having a first select transistor and a first memory transistor is disposed, and a second region, in which a second EEPROM device having a second select transistor and a second memory transistor is disposed; a first drain region and a first floating region, which are disposed apart from each other in the first region of the substrate; a second drain region and a second floating region, which are disposed apart from each other in the second region of the substrate; and a first impurity region, a second impurity region, and a third impurity region, which are disposed between the first region and the second region of the substrate. The first impurity region completely surrounds the second impurity region and the third impurity region in horizontal and vertical directions, the second impurity region surrounds the third impurity region in a horizontal direction, and the junction depth of the third impurity region is greater than the junction depth of the second impurity region.

The dopant concentration of the second impurity region may be higher than the dopant concentration of the first impurity region and lower than the dopant concentration of the third impurity region.

The dopant concentration of the first impurity region may be approximately $5 \times 10^{12}$ to $9 \times 10^{12}$ ions/cm$^2$, the dopant concentration of the second impurity region may be approximately $1 \times 10^{14}$ to $8 \times 10^{14}$ ions/cm$^2$, and the dopant concentration of the third impurity region may be approximately $1 \times 10^{15}$ to $5 \times 10^{15}$ ions/cm$^2$.

The first impurity region may be formed of phosphorus ions, and the second impurity region and the third impurity region may be formed of arsenic ions.

The first drain region and the second drain region may each include the first impurity region and the third impurity region, which completely surrounds the first impurity region in horizontal and vertical directions.

According to another aspect of the present invention, there is provided an EEPROM device, which includes a substrate including a memory cell region, in which an EEPROM cell including a first EEPROM device and a second EEPROM device is disposed, and a peripheral circuit region, in which a high-voltage MOS transistor and a low-voltage MOS transistor are disposed; a common source region, which includes first impurity regions, second impurity regions, and third impurity regions between the first EEPROM device and the second EEPROM device of the memory cell region, wherein a first impurity region completely surrounds a second impurity region and a third impurity region in horizontal and vertical directions, the second impurity region surrounds the third impurity region in a horizontal direction, and the junction depth of the third impurity region is greater than the junction depth of the second impurity region; source/drain regions of the high-voltage MOS transistor, each of which includes a first impurity region and a third impurity region that completely surrounds the first impurity region in horizontal and vertical directions; and source/drain regions of the low-voltage MOS transistor, each of which includes a second impurity region and a third impurity region that is surrounded by the second impurity region but has a greater junction depth than the second impurity region.

The dopant concentration of the second impurity region may be higher than the dopant concentration of the first impurity region and lower than the dopant concentration of the third impurity region.

The dopant concentration of the first impurity region may be approximately $5\times10^{12}$ to $9\times10^{12}$ ions/cm$^2$, the dopant concentration of the second impurity region may be approximately $1\times10^{14}$ to $8\times10^{14}$ ions/cm$^2$, and the dopant concentration of the third impurity region may be approximately $1\times10^{15}$ to $5\times10^{15}$ ions/cm$^2$.

The first impurity region may be formed of phosphorus ions, and the second impurity region and the third impurity region may be formed of arsenic ions.

According to still another aspect of the present invention, there is provided a method of manufacturing an EEPROM cell. The method includes preparing a semiconductor substrate that has a first region in which a first EEPROM device will be formed, a second region in which a second EEPROM device will be formed, and a common source region disposed between the first region and the second region; forming a first gate stack for a first select transistor and a second gate stack for a first memory transistor in the first region of the semiconductor substrate and forming a third gate stack for a second select transistor and a fourth gate stack for a second memory transistor in the second region of the semiconductor substrate; forming first impurity regions with a first dopant concentration respectively in a drain region and a floating region of the first region, in a drain region and a floating region of the second region, and in the common source region by performing a first ion implantation process on the semiconductor substrate on which the first, second, third, and fourth gate stacks are formed; forming second impurity regions with a second dopant concentration respectively in the first impurity regions of the common source region by performing a second ion implantation process on the semiconductor substrate in which the first impurity regions are formed, wherein the second dopant concentration is higher than the first dopant concentration; and forming third impurity regions with a third dopant concentration respectively in the drain region of the first region, in the drain region of the second region, and in the common source region by performing a third ion implantation process on the semiconductor substrate in which the first and second impurity regions are formed. In the common source region, a third impurity region is surrounded by a second impurity region in a horizontal direction but formed to have a greater junction depth than the second impurity region.

The second gate stack for the first memory transistor and the fourth gate stack for the second memory transistor may be separated from each other by the common source region.

The first ion implantation process may be performed with a higher energy than the third ion implantation process, and the third ion implantation process may be performed with a higher energy than the second ion implantation process.

The forming of the second impurity regions may include forming a mask layer pattern, which includes openings that expose portions of the common source region; implanting impurity ions with the second dopant concentration into the common source region by performing the second ion implantation process using the mask layer pattern as an ion implantation mask; and removing the mask layer pattern.

Before implanting the impurity ions, the method of manufacturing an EEPROM cell may further include obliquely implanting impurity ions of an opposite conductivity type toward outer portions of the openings using the mask layer pattern as an ion implantation mask.

The forming of the third impurity regions may include forming a mask layer pattern, which includes openings that expose the drain region of the first region, the common source region, and the drain region of the second region; implanting impurity ions with the third dopant concentration into the drain region of the first region, the common source region, and the drain region of the second region by performing the third ion implantation process using the mask layer pattern as an ion implantation mask; and removing the mask layer pattern.

The first impurity regions may be formed with approximately $5\times10^{12}$ to $9\times10^{12}$ ions/cm$^2$, the second impurity regions may be formed with approximately $1\times10^{14}$ to $8\times10^{14}$ ions/cm$^2$, and the third impurity regions may be formed with approximately $1\times10^{15}$ to $5\times10^{15}$ ions/cm$^2$.

Before performing the second ion implantation process, the method of manufacturing an EEPROM cell may further include implanting impurity ions of an opposite conductivity type to the conductivity type of the first impurity regions.

According to further another aspect of the present invention, there is provided a method of manufacturing an EEPROM device. The method includes preparing a semiconductor substrate including a memory cell region, which has at least two EEPROM devices and a common source region disposed between the EEPROM devices, and a peripheral circuit region, which has a high-voltage MOS transistor and a low-voltage MOS transistor; forming a first gate stack for a select transistor and a second gate stack for a memory transistor in the memory cell region of the semiconductor substrate and forming a third gate stack for the high-voltage MOS transistor and a fourth gate stack for the low-voltage MOS transistor in the peripheral circuit region of the semiconductor substrate; forming first impurity regions with a first dopant concentration in a common source region, a floating region, and a drain region of the memory cell region and in source/drain regions of the high-voltage MOS transistor by performing a first ion implantation process on the semiconductor substrate on which the first, second, third, and fourth gate stacks are formed; forming second impurity regions with a second dopant concentration in the common source region of the memory cell region and in source/drain regions of the low-voltage MOS transistor by performing a second ion implantation process on the semiconductor substrate in which the first impurity regions are formed, wherein the second dopant concentration is higher than the first dopant concentration; and forming third impurity regions with a third dopant concentration in the common source region and the drain region of the memory cell, in the source/drain regions of the high-voltage MOS transistor, and in the source/drain regions of the low-voltage MOS transistor by performing a third ion implantation process on the semiconductor substrate in which the first and second impurity regions are formed.

In the common source region, a third impurity region may be surrounded by a second impurity region in a horizontal direction but formed to have a greater junction depth than the second impurity region.

The second ion implantation process may be performed using a mask layer pattern, which covers the floating region and the drain region of the memory cell region and the source/drain regions of the high-voltage MOS transistor and exposes the common source region of the memory cell region and the source/drain regions of the low-voltage MOS transistor, as an ion implantation mask.

The third ion implantation process may be performed using a mask layer pattern, which covers the floating region of the memory cell region and exposes the common source region and the drain region of the memory cell region, the source/drain regions of the high-voltage MOS transistor, and the source/drain regions of the low-voltage MOS transistor.

Before performing the second ion implantation process, the method of manufacturing an EEPROM device may further include implanting impurity ions of an opposite conductivity type to the conductivity type of the first impurity regions.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

FIGS. 10 through 17 are schematic cross-sectional views illustrating a method of manufacturing an EEPROM device according to the present invention.

DETAILED DESCRIPTION OF THE INVENTION

Figure 1:
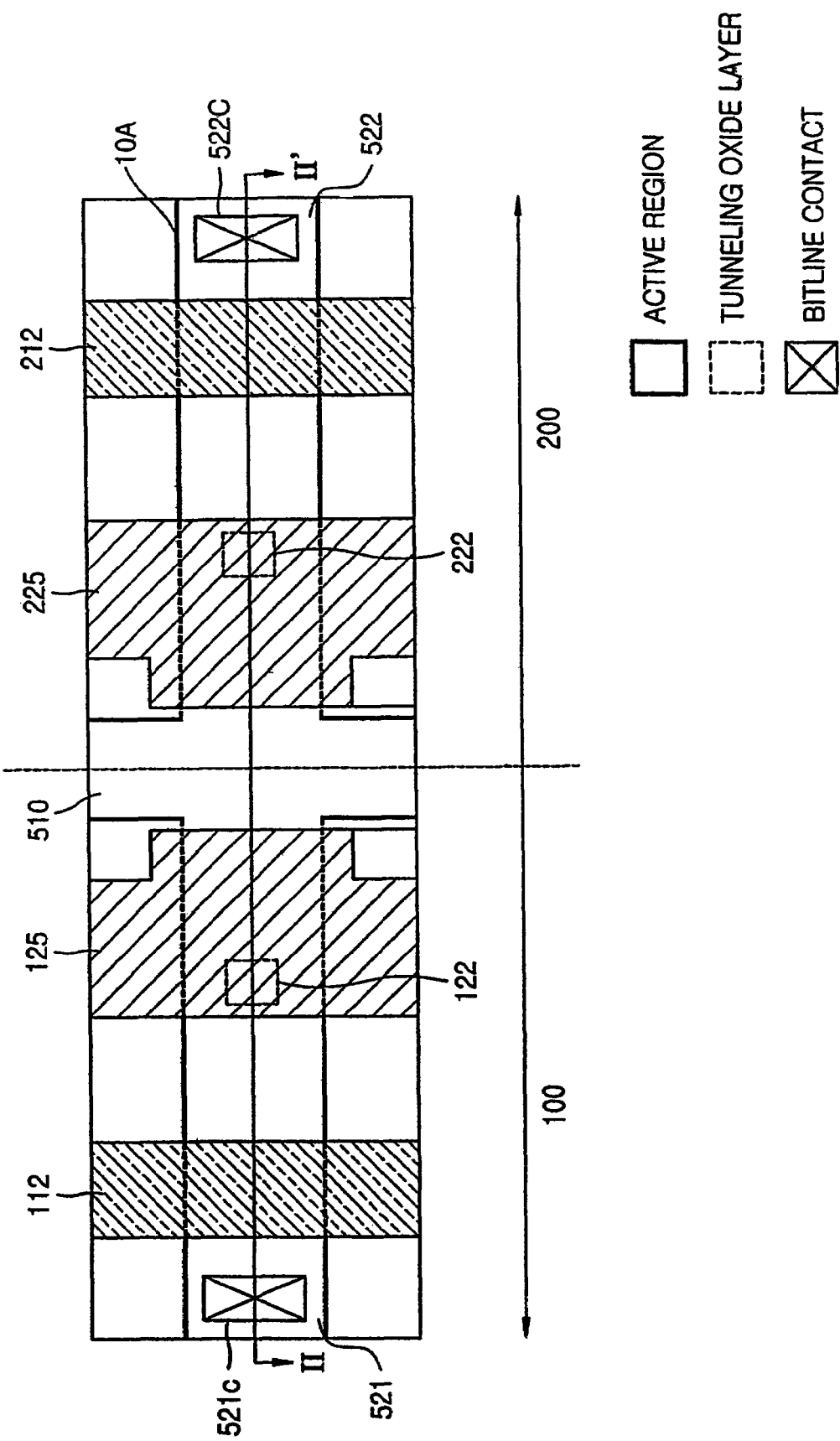
FIG. 1 is a schematic diagram of the layout of an electrically erasable and programmable read only memory (EEPROM) cell according to the present invention.
Figure 2:
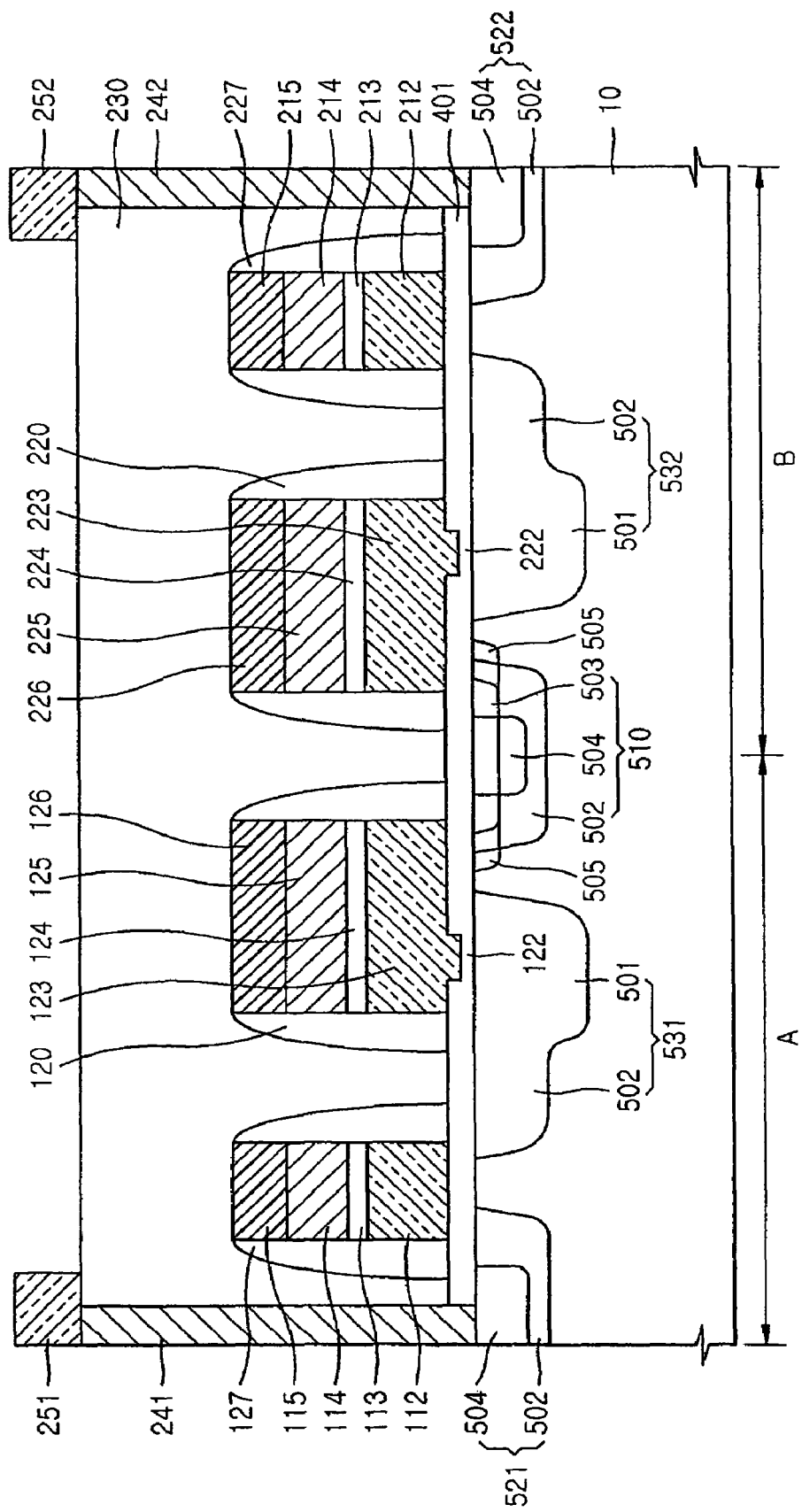
FIG. 2 is a schematic cross-sectional view taken along line II-II' of FIG. 1.

FIG. 1 illustrates the layout of an electrically erasable and programmable read only memory (EEPROM) cell according to the present invention, and FIG. 2 is a cross-sectional view taken along line II-II' of FIG. 1.

Referring to FIG. 1, the EEPROM cell includes at least two EEPROM devices, namely, a first EEPROM device 100 and a second EEPROM device 200, which are disposed symmetrically with respect to a common source region 510. The common source region 510 is disposed in a stripe form in a longitudinal direction. Although not shown in the figures, the common source region 510 is connected to common source regions of other EEPROM cells. The common source region 510 is electrically connected to a source electrode (not shown) by a common source contact (not shown). Since the common source region 510 is commonly connected to a plurality of EEPROM cells, source resistance in an EEPROM cell disposed far away from the common source contact may be greater than that disposed near the common source contact. An active region 10A, defined by an isolation layer, is arranged across the common source region 510.

The first EEPROM device 100 includes a first conductive layer pattern 112 as a word line and a second conductive layer pattern 125 as a sense line. The first and second conductive layer patterns 112 and 125 are spaced a predetermined distance apart from each other. The first conductive layer pattern 112 is adjacent to a first drain region 521, while the second conductive layer pattern 125 is adjacent to the common source region 510. Both the first and second conductive layer patterns 112 and 125 overlap a portion of the active region 10A, and a tunnelling oxide layer 122 is disposed between the second conductive layer pattern 125 and the active region 10A. A first drain contact 521C is disposed in the first drain region 521.

The second EEPROM device 200 includes a third conductive layer pattern 212 as a word line and a fourth conductive layer pattern 225 as a sense line. The third and fourth conductive layer patterns 212 and 225 are spaced a predetermined distance apart from each other. The third conductive layer pattern 212 is adjacent to a second drain region 522, while the fourth conductive layer pattern 225 is adjacent to the common source region 510. The third and fourth conductive layer patterns 212 and 225 overlap a portion of the active region 10A, and a tunnelling oxide layer 222 is disposed between the fourth conductive layer pattern 225 and the active region 10A. A second drain contact 522C is disposed in the second drain region 522.

The following is a detailed description of the structure of the EEPROM cell according to the present invention with reference to FIG. 2. To be more specific, the first EEPROM device 100 and the second EEPROM device 200 are respectively formed in a first region A and a second region B of a semiconductor substrate 10. The common source region 510 is disposed between the first region A and the second region B. In the first region A, the first drain region 521 is disposed a predetermined distance apart from the common source region 510. A first floating region 531 is disposed between the first drain region 521 and the common source region 510. Likewise, the second drain region 522 is disposed a predetermined distance apart from the common source region 510 in the second region B. Also, a second floating region 532 is disposed between the second drain region 522 and the common source region 510.

The common source region 510 includes a first impurity region 502, a second impurity region 503, a third impurity region 504 and a fourth impurity region 505. The first impurity region 502 has the greatest junction depth and junction width, the second impurity region 503 has the smallest junction depth, and the third impurity region 504 has the smallest junction width. Thus, both the second impurity region 503 and the third impurity region 504 are surrounded by the first impurity region 502. Although the third impurity region 504 is also surrounded by the second impurity region 503, since it has a greater junction depth than the second impurity region 503, the bottom surface of the third impurity region 504 is disposed between the bottom surfaces of the first and second impurity regions 502 and 503. The fourth impurity region 505 is formed having a different conductivity type than the first impurity region 502, second impurity region 503 and third impurity region 504.

Within the first region A, the first drain region 521 includes a third impurity region 504 and a first impurity region 502 that completely surrounds the third impurity region 504. The first floating region 531 includes a deep impurity region 501 and a first impurity region 502 that is shallower than the deep impurity region 501. The deep impurity region 501 is connected in parallel to the first impurity region 502. Within the second region B, the second drain region 522 includes a third impurity region 504 and a first impurity region 502 that completely surrounds the third impurity region 504. The second floating region 532 includes a deep impurity region 501 and a first impurity region 502 that is shallower than the deep impurity region 501. Similarly, in the second floating region 532, the deep impurity region 501 is connected in parallel to the first impurity region 502.

The dopant concentration of the first impurity region 502 is the lowest, while the dopant concentration of the third impurity region 504 is the highest. The dopant concentration of the deep impurity region 501 or the second impurity region 503 is intermediate between the first and third impurity regions 502 and 504. For example, the deep impurity region 501 is formed at a dose of approximately $1 \times 10^{13}$ to $9 \times 10^{13}$ ions/cm$^2$, the first impurity region 502 is formed at a dose of approximately $5 \times 10^{12}$ to $9 \times 10^{12}$ ions/cm$^2$, the second impurity region 503 is formed at a dose of approximately $1 \times 10^{14}$ to $8 \times 10^{14}$ ions/ cm², and the third impurity region 504 is formed at a dose of approximately $1\times10^{15}$ to $5\times10^{15}$ ions/cm². The deep impurity region 501, the second impurity region 503, and the third impurity region 504 are doped with arsenic ions, while the first impurity region 502 is doped with phosphorus ions. However, impurity ions doped to form the impurity regions (501, 502, 503, and 504) are not limited thereto, and other kinds of impurity ions can be used instead.

A first select transistor of the first EEPROM device 100 includes the first conductive layer pattern 112, an inter-gate insulating layer pattern 113, a second conductive layer pattern 114, and a silicide layer pattern 115, which are sequentially stacked on a first insulating layer 401 having a thickness of approximately 250 to 500 Å that is formed on the semiconductor substrate 10. Since only the first conductive layer pattern 112 of the stacked structure is used as a word line, the inter-gate insulating layer pattern 113, the second conductive layer pattern 114, and the silicide layer pattern 115 may not be formed. The first insulating layer 401 is a silicon oxide layer. The first and second conductive layer patterns 112 and 114 are each a doped polysilicon layer with a thickness of approximately 1500 Å. The inter-gate insulating layer pattern 113 is an oxide/nitride/oxide (ONO) layer with a thickness of approximately 110 to 220 Å. The silicide layer pattern 115 has a thickness of approximately 1000 Å. Gate spacers 127 are disposed on both sides of the stacked structure that includes the first conductive layer pattern 112, the inter-gate insulating layer pattern 113, the second conductive layer pattern 114, and the silicide layer pattern 115.

A first memory transistor of the first EEPROM 100 includes a first conductive layer pattern 123, an inter-gate insulating layer pattern 124, a second conductive layer pattern 125, and a silicide layer pattern 126, which are sequentially stacked on the first insulating layer 401. Only the second conductive layer pattern 125 of the stacked structure is used as a sense line. In addition to the first insulating layer 401, a tunnelling oxide layer 122 is also partially interposed between the first conductive layer pattern 123 and the semiconductor substrate 10. The tunnelling oxide layer 122 is formed to a thickness of approximately 60 to 80 Å on the deep impurity region 501 formed in the semiconductor substrate 10. Gate spacers 120 are disposed on both sides of the stacked structure that includes the first conductive layer pattern 123, the inter-gate insulating layer pattern 124, the second conductive layer pattern 125, and the silicide layer pattern 126.

The second EEPROM device 200 has a similar structure to the first EEPROM device 100. To be more specific, a second select transistor includes the third conductive layer pattern 212, an inter-gate insulating layer pattern 213, a second conductive layer pattern 214, and a silicide layer pattern 215, which are sequentially stacked on the first insulating layer 401. Only the second conductive layer pattern 212 of the stacked structure is used as a word line. Gate spacers 227 are disposed on both sides of the stacked structure that includes the third conductive layer pattern 212, the inter-gate insulating layer pattern 213, the second conductive layer pattern 214, and the silicide layer pattern 215. A second memory transistor includes a first conductive layer pattern 223, an inter-gate insulating layer pattern 224, a fourth conductive layer pattern 225, and a silicide layer pattern 226, which are sequentially stacked on the first insulating layer 401. Only the fourth conductive layer pattern 225 of the stacked structure is used as a sense line. In addition to the first insulating layer 401, a tunnelling oxide layer 222 is also partially interposed between the first conductive layer pattern 223 and the semiconductor substrate 10. Gate spacers 220 are disposed on both sides of the stacked structure that includes the first conductive layer pattern 223, the inter-gate insulating layer pattern 224, the fourth conductive layer pattern 225, and the silicide layer pattern 226.

The first drain region 521 is connected to a first metal layer pattern 251 by a conductive plug 241 that is formed via an interlayer dielectric (ILD) layer 230. The second drain region 522 is connected to a second metal layer pattern 252 by a second conductive plug 242 that is formed via the ILD layer 230. Although not shown in the figures, a common source region is connected to a metal layer pattern in a common source contact region.

Figure 3:
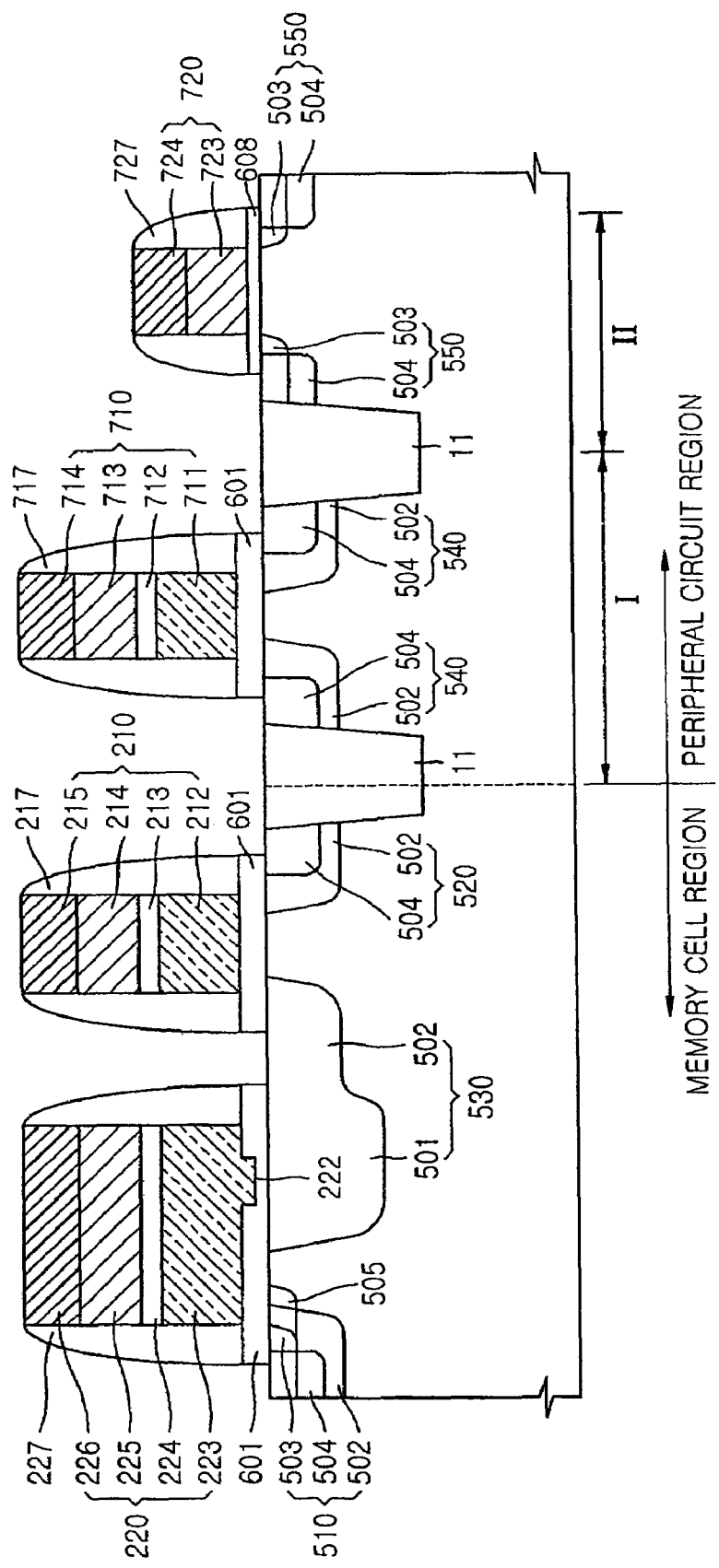
FIG. 3 is a schematic cross-sectional view of an EEPROM device according to the present invention.

FIG. 3 is a cross-sectional view of an EEPROM device according to the present invention.

Referring to FIG. 3, memory cells and peripheral circuits are respectively disposed in a memory cell region and a peripheral circuit region of a semiconductor substrate 10. A memory cell in the memory cell region includes two EEPROM devices that have a common source region, as shown in FIG. 2. Hereinafter, only one EEPROM device of the two EEPROM devices forming the memory cell will be described for clarity of description. As described with reference to FIG. 2, the other EEMPROM device of the two EEPROM devices has a symmetrical and substantially identical structure thereto. In the peripheral circuit region, there are a variety of active devices and passive devices, each of which can include an active region defined by an isolation layer 11. The active devices include high-voltage transistors, intermediate-voltage transistors, and low-voltage transistors. However, in the present embodiment, only a high-voltage n-type MOS transistor disposed in a first region I of the peripheral circuit region and a low-voltage n-type MOS transistor disposed in a second region II of the peripheral circuit region are described, and a detailed description of other circuit devices will be omitted.

At the outset, a common source region 510 and a drain region 520 are disposed a predetermined distance apart from each other in the memory cell region of the semiconductor substrate 10. A floating region 530 is disposed between the common source region 510 and the drain region 520. In the first region I of the peripheral circuit region of the semiconductor substrate 10, source/drain regions 540 are disposed apart from each other. Also, other source/drain regions 550 are disposed apart from each other in the second region II of the peripheral circuit region of the semiconductor substrate 10.

The common source region 510 in the memory cell region includes a first impurity region 502, a second impurity region 503, and a third impurity region 504. The first impurity region 502 has the greatest junction depth and junction width. The second impurity region 503 has the smallest junction depth, and the third impurity region 504 has the smallest junction width. Thus, both the second impurity region 503 and the third impurity region 504 are surrounded by the first impurity region 502. Although the third impurity region 504 is surrounded by the second impurity region 503, since the junction depth of the third impurity region 504 is greater, the bottom surface of the third impurity region 504 is disposed between the bottom surfaces of the first and second impurity regions 502 and 503. Hence, the common source region 510 in the memory cell region includes both a lightly doped drain (LDD) structure and a double diffused drain (DDD) structure.

The drain region 520 in the memory cell region includes a third impurity region 504 and a first impurity region 502 that completely surrounds the third impurity region 504. Thus, the drain region 520 in the memory cell region has a DDD structure. The floating region 530 in the memory cell region includes a deep impurity region 501 and a first impurity region 502 that is shallower than the deep impurity region 501. Here, the deep impurity region 501 is connected in parallel to the first impurity region 502.

The source/drain regions 540 in the first region I of the peripheral circuit region each include a third impurity region 504 and a first impurity region 502 that completely surrounds the third impurity region 504. The source/drain regions 504 have a DDD structure. The source/drain regions 550 in the second region II of the peripheral circuit region each include a second impurity region 503 and a third impurity region 504. Here, the second impurity region 503 has a greater junction width and a smaller junction depth than the third impurity region 504. The source/drain regions 550 have an LDD structure.

The dopant concentration of the first impurity region 502 is the lowest, while the dopant concentration of the third impurity region 504 is the highest. Also, the dopant concentration of the deep impurity region 501 or the second impurity region 503 is intermediate between the first and third impurity regions 502 and 504. For example, the deep impurity region 501 is formed at a dose of approximately $1\times10^{13}$ to $9\times10^{13}$ ions/cm$^2$, the first impurity region 502 is formed at a dose of approximately $5\times10^{12}$ to $9\times10^{12}$ ions/cm$^2$, the second impurity region 503 is formed at a dose of approximately $1\times10^{14}$ to $8\times10^{14}$ ions/cm$^2$, and the third impurity region 504 is formed at a dose of approximately $1\times10^{15}$ to $5\times10^{15}$ ions/cm$^2$. The deep impurity region 501, the second impurity region 503, and the third impurity region 504 are doped with arsenic ions, while the first impurity region 502 is doped with phosphorus ions. However, impurity ions doped to form the impurity regions (501, 502, 503, and 504) are not limited thereto, and other kinds of impurity ions can be used instead.

A select transistor in the memory cell region includes a gate stack 210 formed on a first insulating layer 601 disposed on the semiconductor substrate 10. The gate stack 210 includes a third conductive layer pattern 212, an inter-gate insulating layer pattern 213, a second conductive layer pattern 214, and a silicide layer pattern 215, which are sequentially stacked. Among these layers, only the third conductive layer pattern 212 is used as a word line. Thus, the inter-gate insulating layer pattern 213, the second conductive layer pattern 214, and the silicide layer pattern 215 may not be formed. The first insulating layer 601 is a gate insulating layer formed of silicon oxide to a thickness of approximately 250 to 500 Å. The first and second conductive layer patterns 212 and 214 are each a doped polysilicon layer with a thickness of approximately 1500 Å. The inter-gate insulating layer pattern 213 is an ONO layer with a thickness of approximately 110 to 220 Å. Also, the silicide layer pattern 215 has a thickness of approximately 1000 Å. Gate spacers 217 are formed on both sides of the gate stack that includes the third conductive layer pattern 212, the inter-gate insulating layer pattern 213, the second conductive layer pattern 214, and the silicide layer pattern 215.

A memory transistor in the memory cell region includes a gate stack 220 disposed on the first insulating layer 601. The gate stack 220 includes a first conductive layer pattern 223, an inter-gate insulating layer pattern 224, a fourth conductive layer pattern 225, and a silicide layer pattern 226, which are sequentially stacked. Only the fourth conductive layer pattern 225 of the gate stack 220 is used as a sense line. In addition to the first insulating layer 601, a tunnelling oxide layer 222 is also partially interposed between the first conductive layer pattern 223 and the semiconductor substrate 10. On top of the deep impurity region 501 of the semiconductor substrate 10, the tunnelling oxide layer 222 is formed to a thickness of approximately 60 to 80 Å. Gate spacers 227 are disposed on both sides of the gate stack 220 that includes the first conductive layer pattern 223, the inter-gate insulating layer pattern 224, the fourth conductive layer pattern 225, and the silicide layer pattern 226.

In the first region I of the peripheral circuit region, a gate stack 710 of a high-voltage n-type MOS transistor is disposed. The gate stack 710 includes a first conductive layer pattern 711, an inter-gate insulating layer 712, a second conductive layer pattern 713, and a silicide layer 714, which are sequentially stacked on a first insulating layer 601. Gate spacers 717 are disposed on both sides of the gate stack 710 that includes the first conductive layer pattern 711, the inter-gate insulting layer 712, the second conductive layer pattern 713, and the silicide layer 714. In the second region II of the peripheral circuit region, a gate stack 720 of a low-voltage n-type MOS transistor is disposed. The gate stack 720 includes a second conductive layer pattern 723 and a silicide layer 724, which are sequentially stacked on a second insulating layer 608. The second insulating layer 608 has a smaller thickness than the first insulating layer 601. Gate spacers 727 are disposed on both sides of the gate stack 720 that includes the second conductive layer pattern 723 and the silicide layer 724.

Although not shown in the figures, respective impurity regions of the memory cell region, i.e., the common source region 510 and the drain region 520 are electrically connected to metal electrodes. In the peripheral circuit region, the source/drain regions 540 of the high-voltage n-type MOS transistor and the source/drain regions 550 of the low-voltage n-type MOS transistor are respectively connected to metal electrodes.

FIGS. 4 through 9 are cross-sectional views illustrating a method of manufacturing an EEPROM cell according to an embodiment of the present invention.

Figure 4:
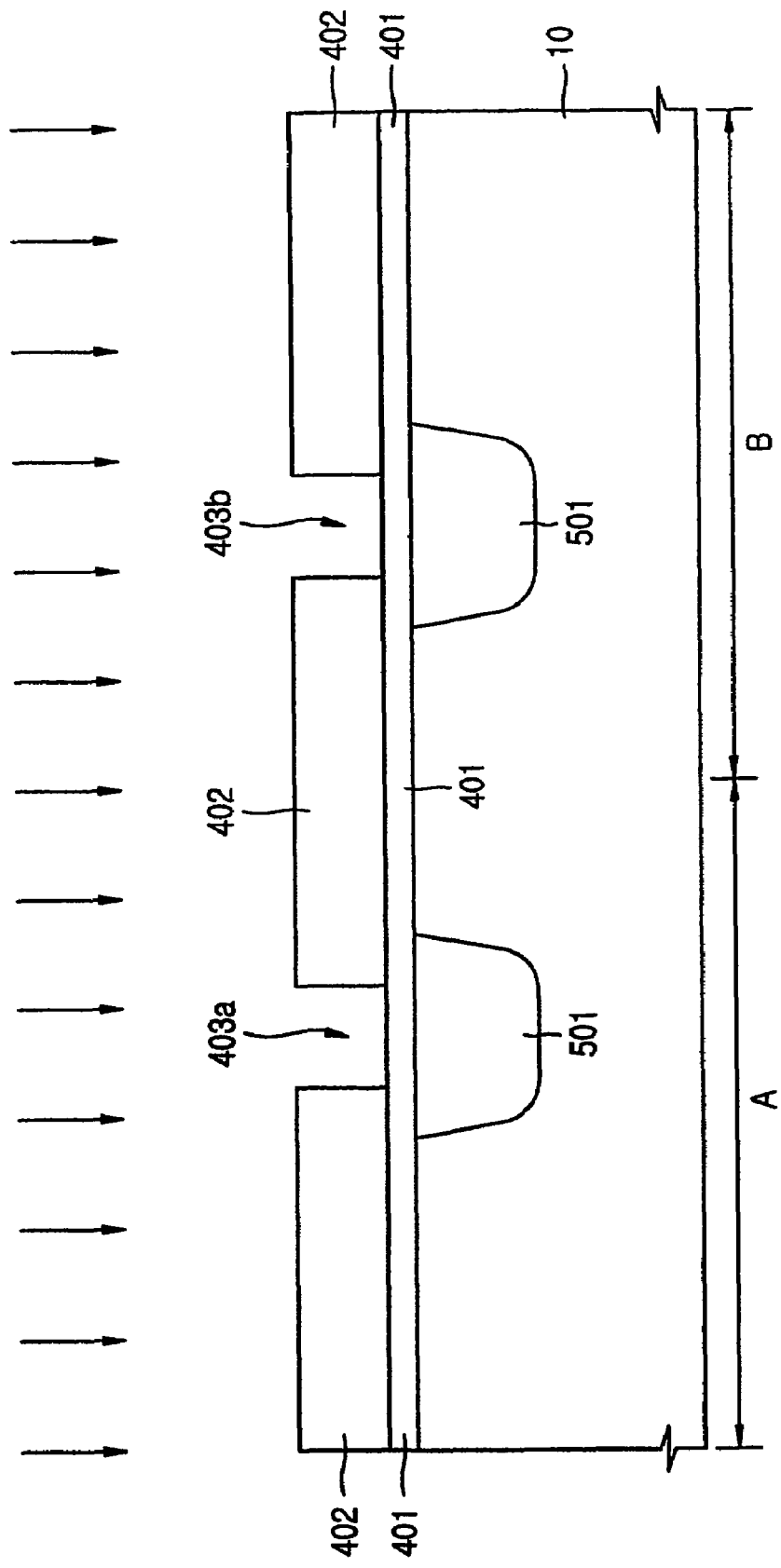
FIGS. 4 through 9 are schematic cross-sectional views illustrating a method of manufacturing an EEPROM cell according to the present invention.

Referring to FIG. 4, a first insulating layer 401, for example, a silicon oxide layer, is formed on a semiconductor substrate 10 that has a first region A and a second region B. The first insulating layer 401 is formed to a thickness of approximately 250 to 500 Å. A mask layer pattern 402, such as a photoresist layer pattern, is formed on the first insulating layer 401. The mask layer pattern 402 includes openings 403a and 403b, which expose portions of the surface of the first insulating layer 401. The opening 403a is formed in the first region A, while the opening 403b is formed in the second region B. N-type impurity ions are implanted into the semiconductor substrate 10 using the mask layer pattern 402 as an ion implantation mask, thereby forming deep impurity regions 501. Here, arsenic ions can be implanted with an energy of approximately 100 KeV and a dose of approximately $1\times10^{13}$ to $9\times10^{13}$ ions/cm$^2$. After the deep impurity regions 501 are formed, the mask layer pattern 402 is removed.

Figure 5:
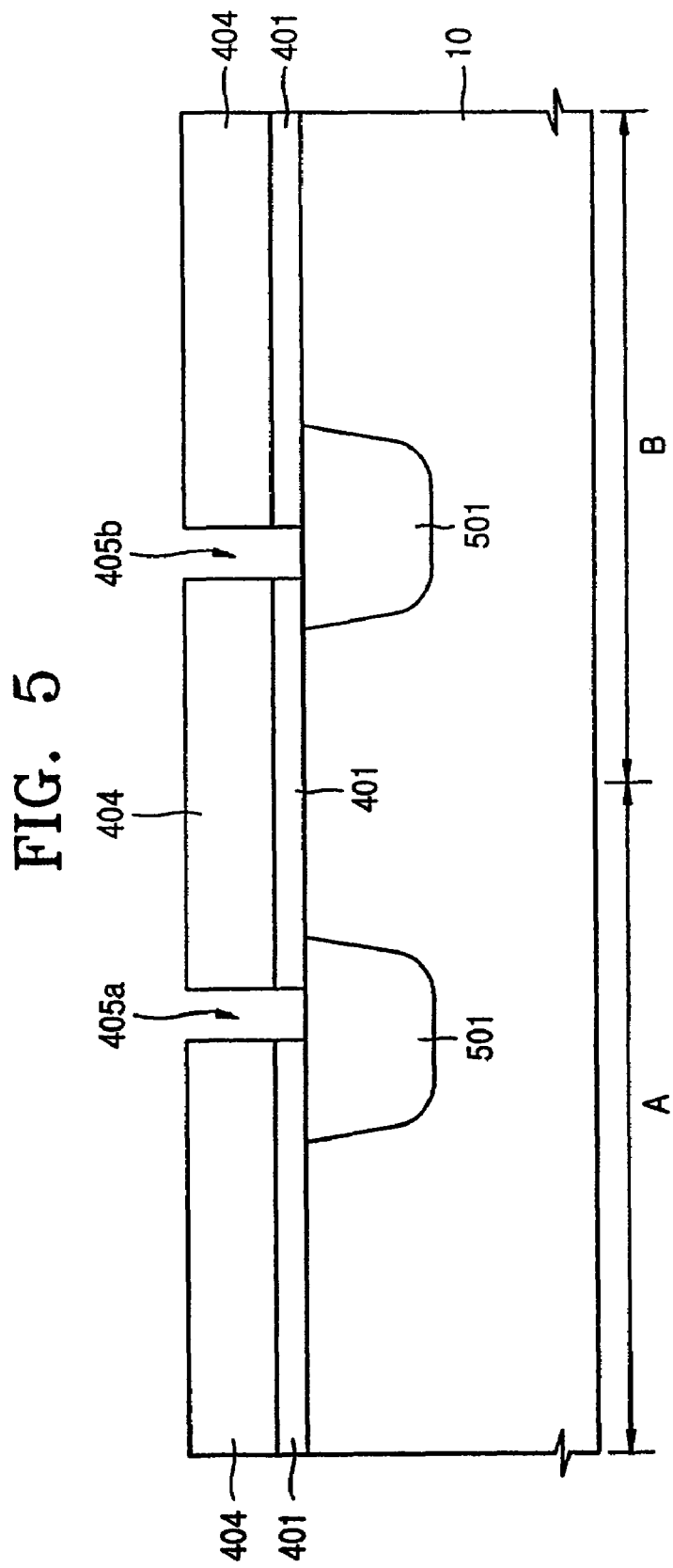

Referring to FIG. 5, another mask layer pattern 404, such as a photoresist layer pattern, is formed on the first insulating layer 401. The mask layer pattern 404 also includes openings 405a and 405b, which expose portions of the surface of the first insulating layer 401. The opening 405a is formed in the first region A, while the opening 405b is formed in the second region B. The openings 405a and 405b expose the portions of the surface of the first insulating layer 401, on which tunnelling oxide layers will be formed, and the portions exposed by the openings 405a and 405b overlap the deep impurity regions 501. An etching process is carried out using the mask layer pattern 404 as an etch mask until the exposed portions of the surface of the first insulating layer 401 are removed. After the etching process, the mask layer pattern 404 is removed.

Figure 6:
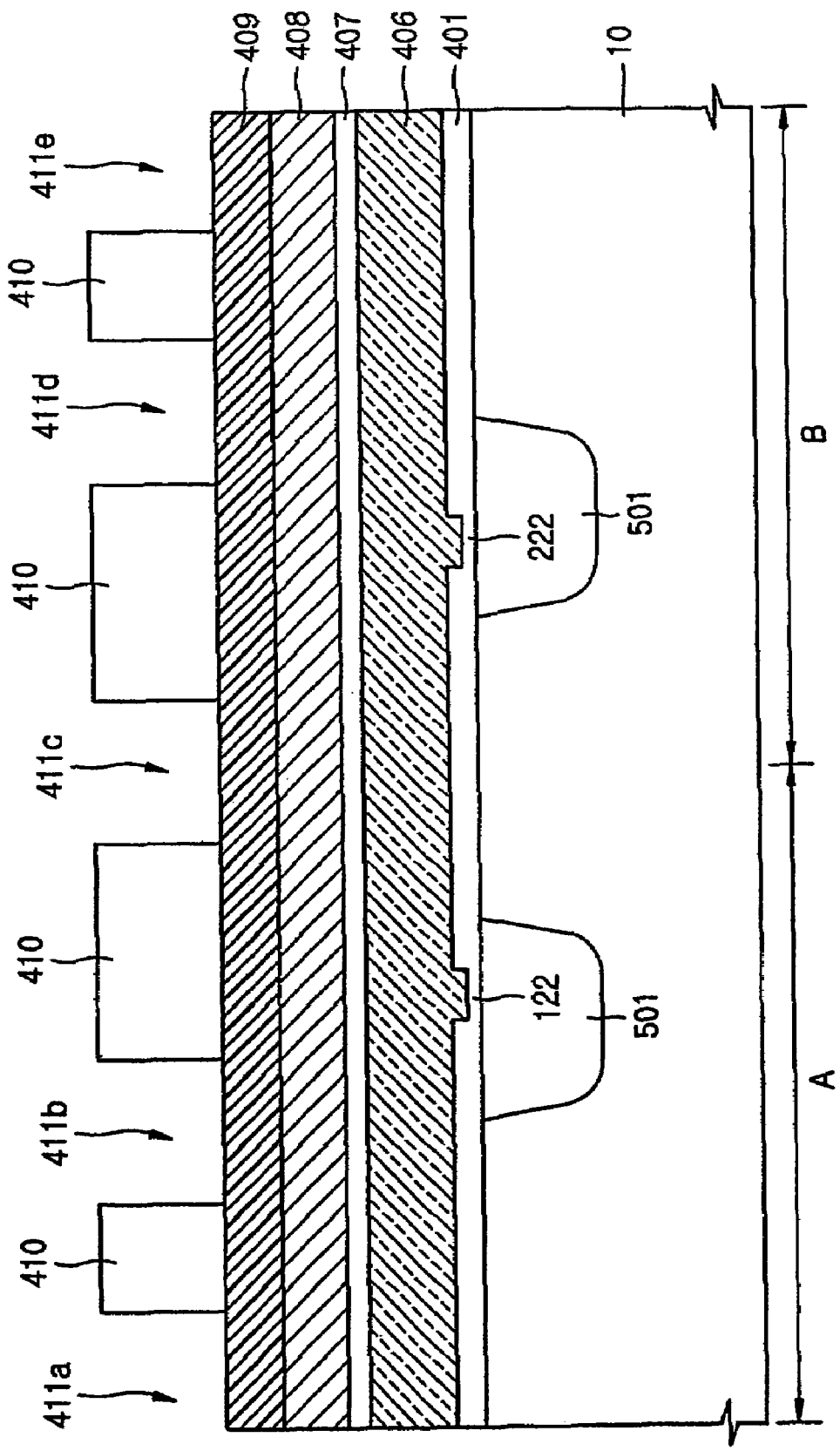

Referring to FIG. 6, tunnelling oxide layers 122 and 222 are formed on the exposed portions of the semiconductor substrate 10. The tunnelling oxide layers 122 and 222 each have a smaller thickness than the first insulating layer 401 of, for example, approximately 60 to 80 Å. A first conductive layer 406, an inter-gate insulating layer 407, and a second conductive layer 408 are sequentially stacked on the first insulating layer 401 and the tunnelling oxide layers 122 and 222. The first and second conductive layers 406 and 408 are each formed of polysilicon to a thickness of approximately 1500 Å. The inter-gate insulating layer 407 is formed of oxide/nitride/oxide (ONO) to a thickness of approximately 110 to 220 Å. On top of the second conductive layer 408, a silicide layer 409 is formed to a thickness of approximately 1000 Å using an ordinary silicidation process. Also, another mask layer pattern 410, such as a photoresist layer pattern, is formed on the silicide layer 409. The mask layer pattern 410 includes openings 411a, 411b, 411c, 411d, and 411e, which expose portions of the surface of the silicide layer 409.

Figure 7:
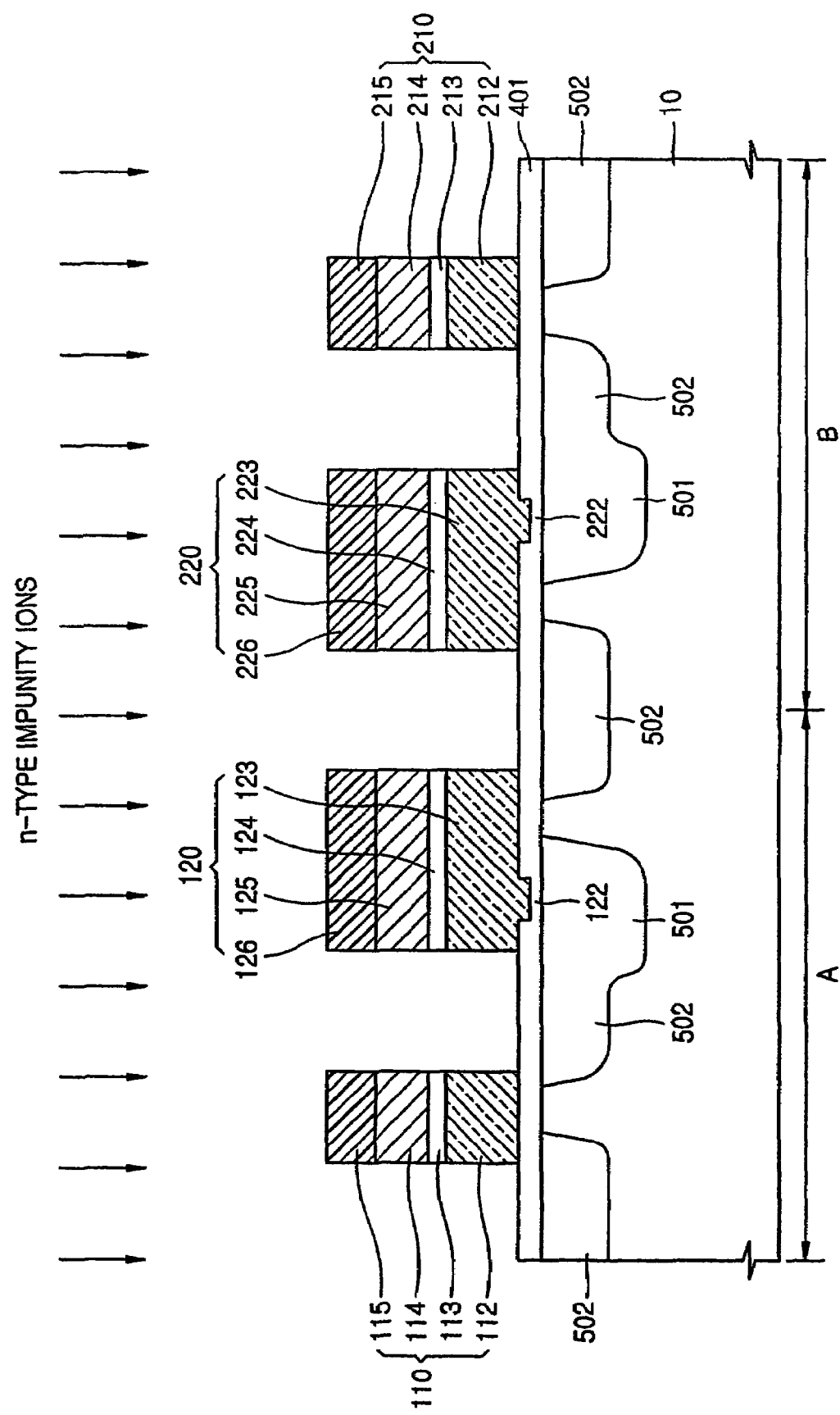

Referring to FIG. 7, an etching process is executed using the mask layer pattern 410 as an etch mask, thereby sequentially removing portions of the silicide layer 409, the second conductive layer 408, the inter-gate insulating layer 407, and the first conductive layer 406. As a result, a gate stack 110 of a first select transistor and a gate stack 120 of a first memory transistor are formed apart from each other in the first region A, while a gate stack 210 of a second select transistor and a gate stack 220 of a second memory transistor are formed apart from each other in the second region B. Also, the gate stack 120 of the first memory transistor and the gate stack 220 of the second memory transistor are disposed apart from each other.

The gate stack 110 of the first select transistor includes a first conductive layer pattern 112, an inter-gate insulating layer pattern 113, a second conductive layer pattern 114, and a silicide layer pattern 115, which are sequentially stacked. The gate stack 120 of the first memory transistor includes a first conductive layer pattern 123, an inter-gate insulating layer pattern 124, a second conductive layer pattern 125, and a silicide layer pattern 126, which are sequentially stacked. The gate stack 210 of the second transistor includes a third conductive layer pattern 212, an inter-gate insulating layer pattern 213, a second conductive layer pattern 214, and a silicide layer pattern 215, which are sequentially stacked. Also, the gate stack 220 of the second memory transistor includes a first conductive layer pattern 223, an inter-gate insulating layer pattern 224, a fourth conductive layer pattern 225, and a silicide layer pattern 226, which are sequentially stacked.

N-type impurity ions are implanted into the semiconductor substrate 10 by using the gate stack 110 of the first select transistor, the gate stack 120 of the first memory transistor, the gate stack 210 of the second select transistor, and the gate stack 220 of the second memory transistor as an ion implantation mask. Here, phosphorus ions are used as the n-type impurity ions and are implanted with an energy of 90 KeV and a dose of approximately $5 \times 10^{12}$ to $9 \times 10^{12}$ ions/cm². Thus, first impurity regions 502 are formed in the semiconductor substrate 10 adjacent to the gate stacks 110, 120, 210, and 220. In particular, a first impurity region 502 disposed between the gate stack 110 of the first select transistor and the gate stack 120 of the first memory transistor in the first region A is connected to one deep impurity region 501. Likewise, a first impurity region 502 disposed between the gate stack 210 of the second select transistor and the gate stack 220 of the second memory transistor in the second region B is connected to another deep impurity region 501.

Figure 8B:
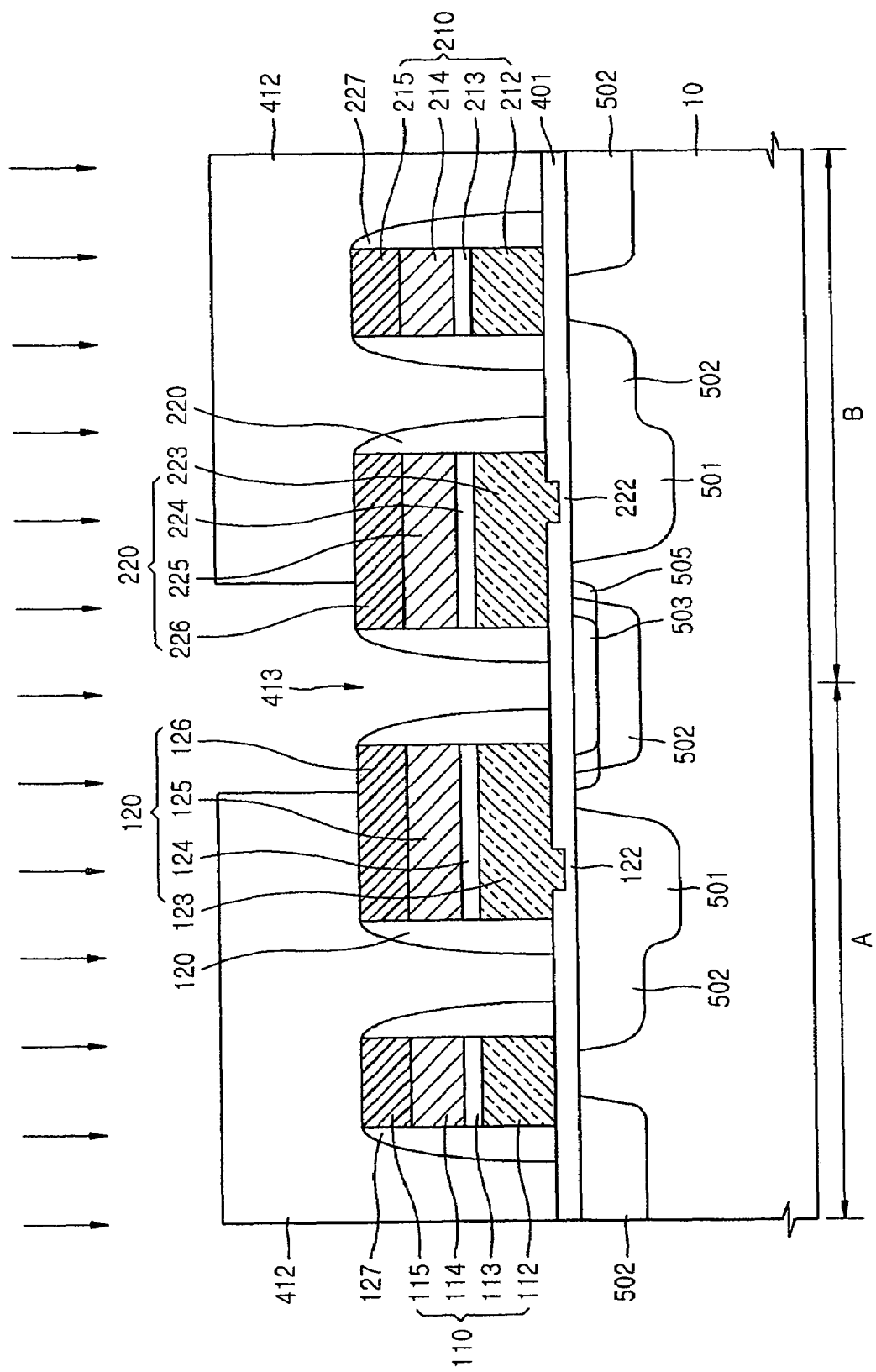

Referring to FIG. 8B, another mask layer pattern 412, such as a photoresist layer pattern, is formed on the resultant structure. This mask layer pattern 412 has an opening 413, which exposes a portion of the surface of the first insulating layer 401 disposed between the gate stack 120 of the first memory transistor in the first region A and the gate stack 220 of the second memory transistor in the second region B. To secure a sufficient alignment margin, a portion of the gate stack 120 of the first memory transistor and a portion of the gate stack 220 of the second memory transistor are exposed when the opening 413 is formed. An ion implantation process is implemented using the mask layer pattern 412 as an ion implantation mask, thereby implanting n-type impurity ions into the semiconductor substrate 10. Here, arsenic ions are used as the n-type impurity ions and are implanted with an energy of approximately 25 KeV and a dose of $1 \times 10^{14}$ to $8 \times 10^{14}$ ions/cm². Thus, in the portion of the surface of the semiconductor substrate 10 disposed between the gate stack 120 of the first memory transistor and the gate stack 220 of the second memory transistor, i.e., in a common source region, a second impurity region 503 is provided. The second impurity region 503 is formed within the first impurity region 502 and has a higher dopant concentration than the first impurity region 502. After the second impurity region 503 is formed, the mask layer pattern 412 is removed.

Prior to the above-described n-type impurity ion implantation process, as shown in FIG. 8A, a p-type impurity ion implantation process is performed to form fourth impurity region 505 to restrict the diffusion of n-type impurity ions to a certain width. Thus, during this p-type impurity ion implantation process, p-type impurity ions are obliquely doped at a certain angle of, for example, 20 to 40°. Boron ions are used as the p-type impurity ions and are implanted with an energy of approximately 30 KeV and a dose of $1 \times 10^{12}$ to $5 \times 10^{12}$ ions/cm². The angle of implantation is not specifically limited, but it is preferable to perform an oblique ion implantation process in all symmetrical directions.

Figure 9:
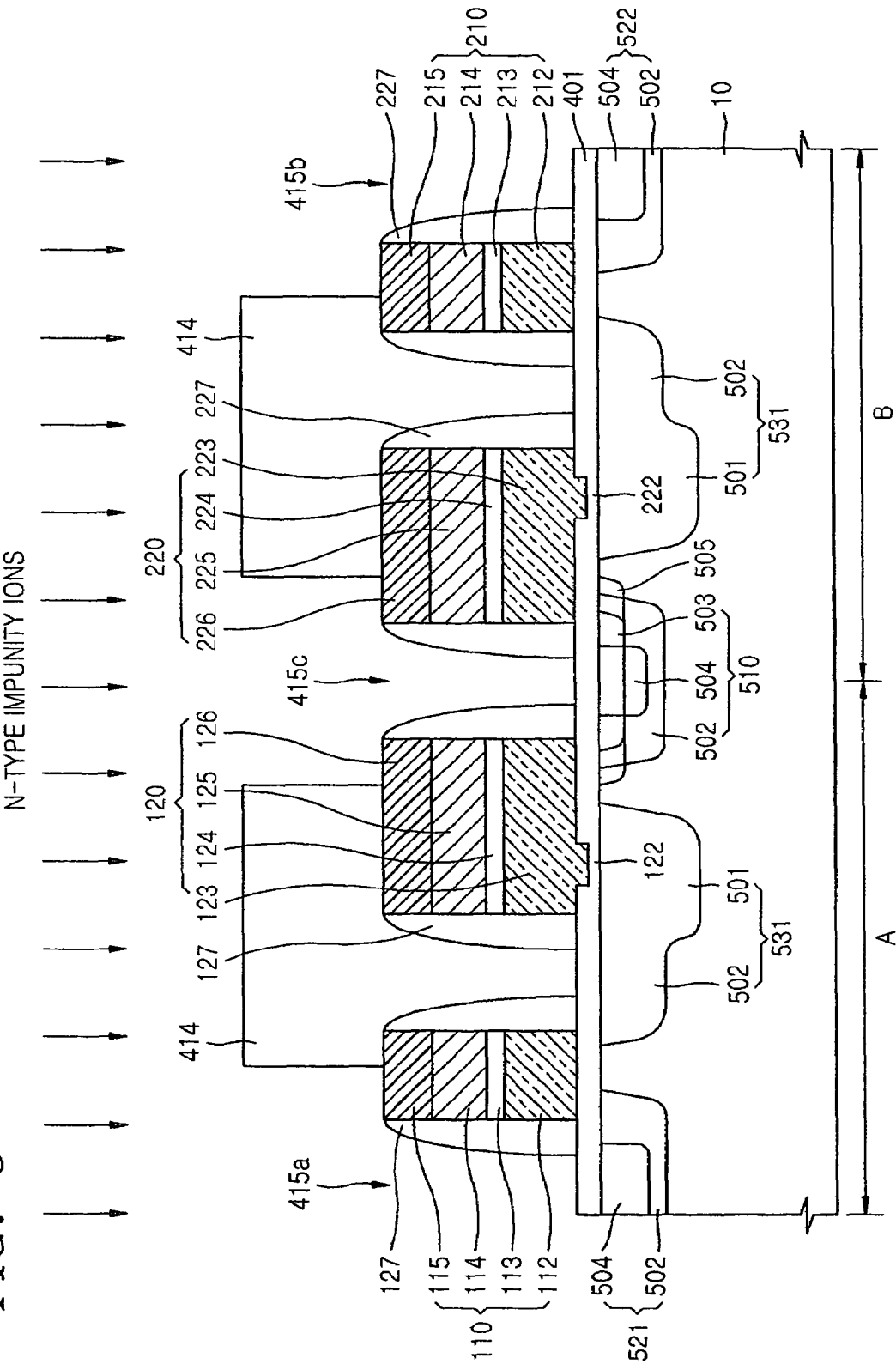

Referring to FIG. 9, a typical spacer forming process is performed, thereby forming gate spacers 127 on sidewalls of the gate stack 110 of the first select transistor and forming gate spacers 227 on sidewalls of the gate stack 210 of the second select transistor. Next, a mask layer pattern 414 is formed on the resultant structure. The mask layer pattern 414 includes openings 415a, 415b, and 415c, which expose a drain region of the first region A, a drain region of the second region B, and the common source region, respectively. N-type impurity ions are implanted into the semiconductor substrate 10 using the mask layer pattern 414 as an ion implantation mask. Arsenic ions are used as the n-type impurity ions and are implanted with an energy of approximately 50 KeV and a dose of $1 \times 10^{15}$ to $5 \times 10^{15}$ ions/cm². Thus, third impurity regions 504 are formed in the drain region of the first region A and the drain region of the second region B. Also, a third impurity region 504 is formed in a portion of the surface of the semiconductor substrate 10 disposed between the gate stack 120 of the first memory transistor and the gate stack 220 of the second memory transistor, i.e., in the common source region. This third impurity region 504 is formed within the first and second impurity regions 502 and 503, and the junction depth thereof is smaller than that of the first impurity region 502 and greater than that of the second impurity region 503. Also, the dopant concentration of the third impurity region 504 is higher than that of the first impurity region 502 or the second impurity region 503. After the third impurity region 504 is formed, the mask layer pattern 414 is removed.

Thereafter, a typical metalization process is performed to thereby form metal interconnections. As shown in FIG. 2, an interlayer dielectric (ILD) layer 230 is formed on the entire surface of the resultant structure. A portion of the ILD layer 230 is removed such that a portion of the first drain region 521 and a portion of the second drain region 522 are exposed. Then, a first conductive plug 241 and a second conductive plug 242 are formed, and a first metal layer pattern 251 and a second metal layer pattern 252 are formed on the first and second conductive plugs 241 and 242, respectively.

Hereinafter, a method of manufacturing an EEPROM device according to the present invention will be described with reference to FIGS. 10 through 17.

Figure 10:
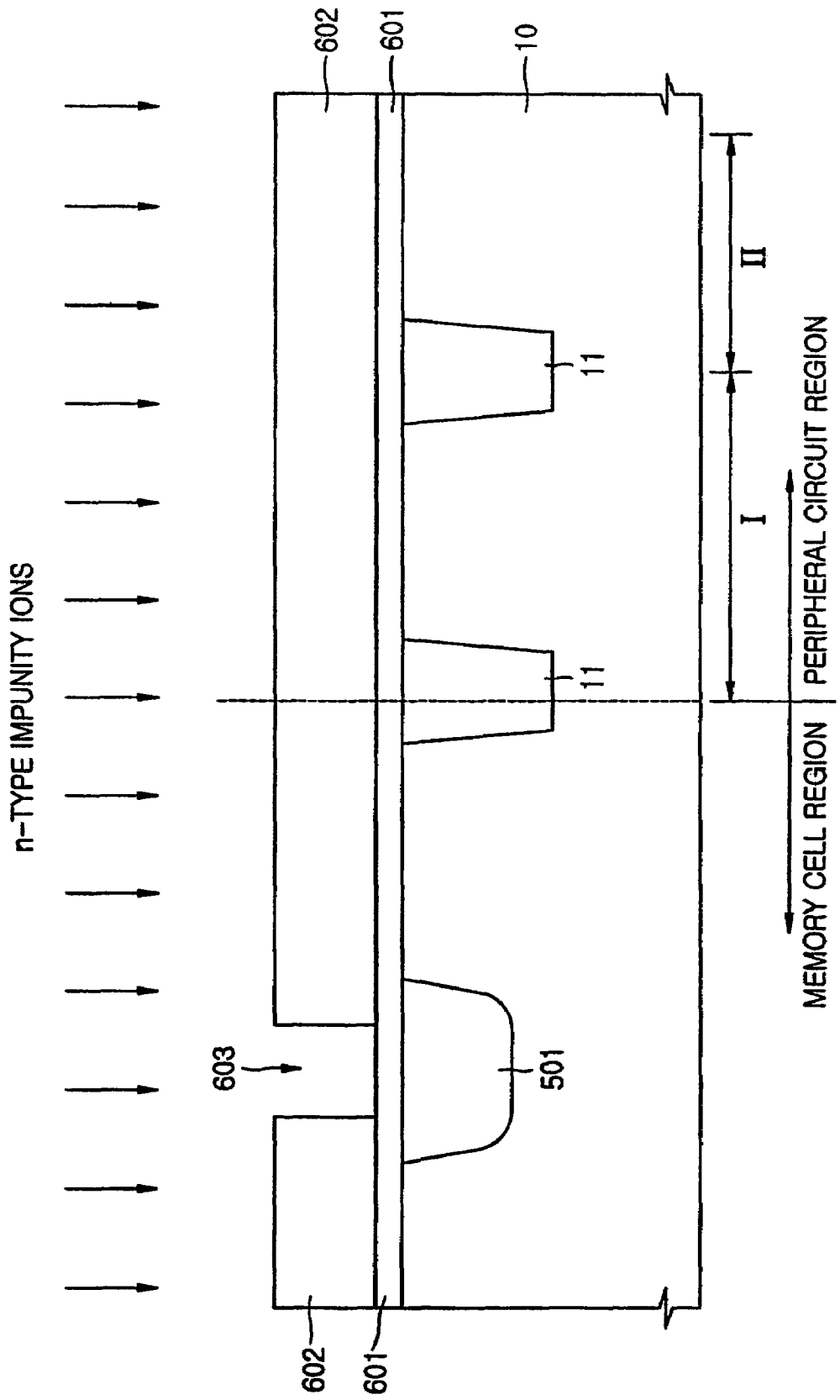

Referring to FIG. 10, a semiconductor substrate 10 that has a memory cell region and a peripheral circuit region is prepared. In the memory cell region, an EEPROM device is formed. The peripheral circuit region includes a first region I and a second region II. A high-voltage n-type MOS transistor is disposed in the first region I of the peripheral circuit region, while a low-voltage n-type MOS transistor is disposed in the second region II thereof. In the peripheral circuit region, other MOS transistors, such as a high-voltage p-type MOS transistor and a low-voltage p-type MOS transistor or passive devices may be additionally disposed. That is, the EEPROM device is disposed in the memory cell region of the semiconductor substrate 10, while the high-voltage MOS transistor and the low-voltage MOS transistor are disposed in the peripheral circuit region.

An isolation layer 11 is formed in the semiconductor substrate 10 to define active regions. Although the isolation layer 11 is illustrated as a trench type in the figures, the form thereof is not limited thereto. A first insulating layer 601, for example, a silicon oxide layer, is formed on the semiconductor substrate 10 in which the isolation layer 11 is formed. The first insulating layer 601 is formed to a thickness of approximately 250 to 500 Å. A mask layer pattern 602, such as a photoresist layer pattern, is formed on the first insulating layer 601. This mask layer pattern 602 covers the entire surface of the peripheral circuit region and includes an opening 603 that exposes a portion of the surface of the first insulating layer 601 in the memory cell region. N-type impurity ions are implanted into the semiconductor substrate 10 using the mask layer pattern 602 as an ion implantation mask, thereby forming a deep impurity region 501. Arsenic ions are used as the n-type impurity ions and are implanted with an energy of approximately 100 KeV and a dose of $1\times10^{13}$ to $9\times10^{13}$ ions/cm$^2$. After the deep impurity region 501 is formed, the mask layer pattern 602 is removed.

Figure 11:
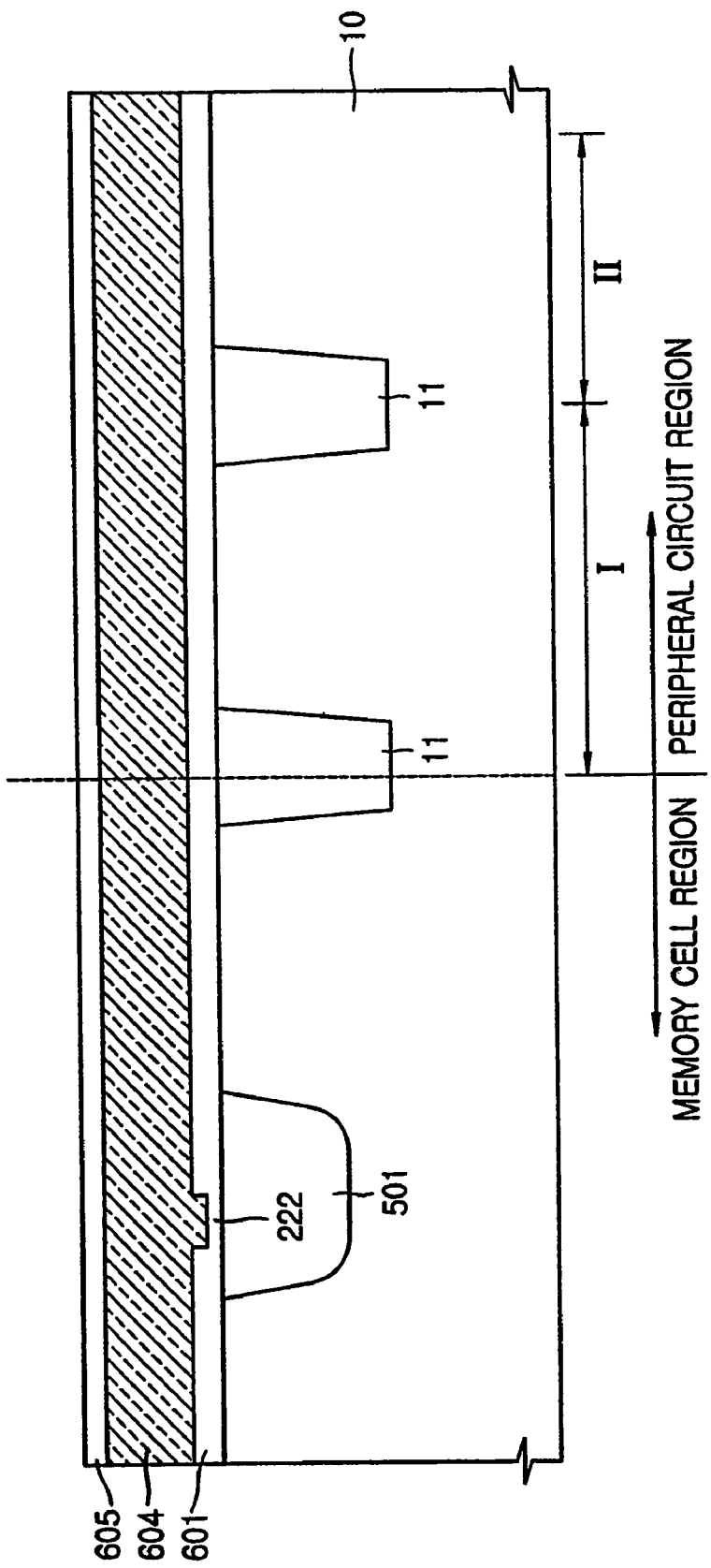

Referring to FIG. 11, another mask layer pattern (not shown), such as a photoresist layer pattern, is formed on the first insulating layer 601. This mask layer pattern exposes a portion of the surface of the first insulating layer 601 in the memory cell region. In the memory cell region, a tunnelling oxide layer will be formed on the exposed portion of the first insulating layer 601, which overlaps the deep impurity region 501. An etching process is performed using the mask layer pattern as an etch mask, thereby removing the exposed portion of the first insulating layer 601. This etching process is continued until a portion of the surface of the semiconductor substrate 10 is exposed. After the etching process, the mask layer pattern is removed. Then, a tunnelling oxide layer 222 is formed on the exposed portion of the semiconductor substrate 10 using an oxidization process. The tunnelling oxide layer 222 is formed to a smaller thickness than the first insulating layer 601, for example, to approximately 60 to 80 Å. A first conductive layer 604 is formed on the first insulating layer 601 and the tunnelling oxide layer 222, and an inter-gate insulating layer 605 is formed thereon. The first conductive layer 604 is formed of polysilicon to a thickness of approximately 1500 Å, and the inter-gate insulating layer 605 is formed of ONO to a thickness of about 110 to 220 Å.

Figure 12:
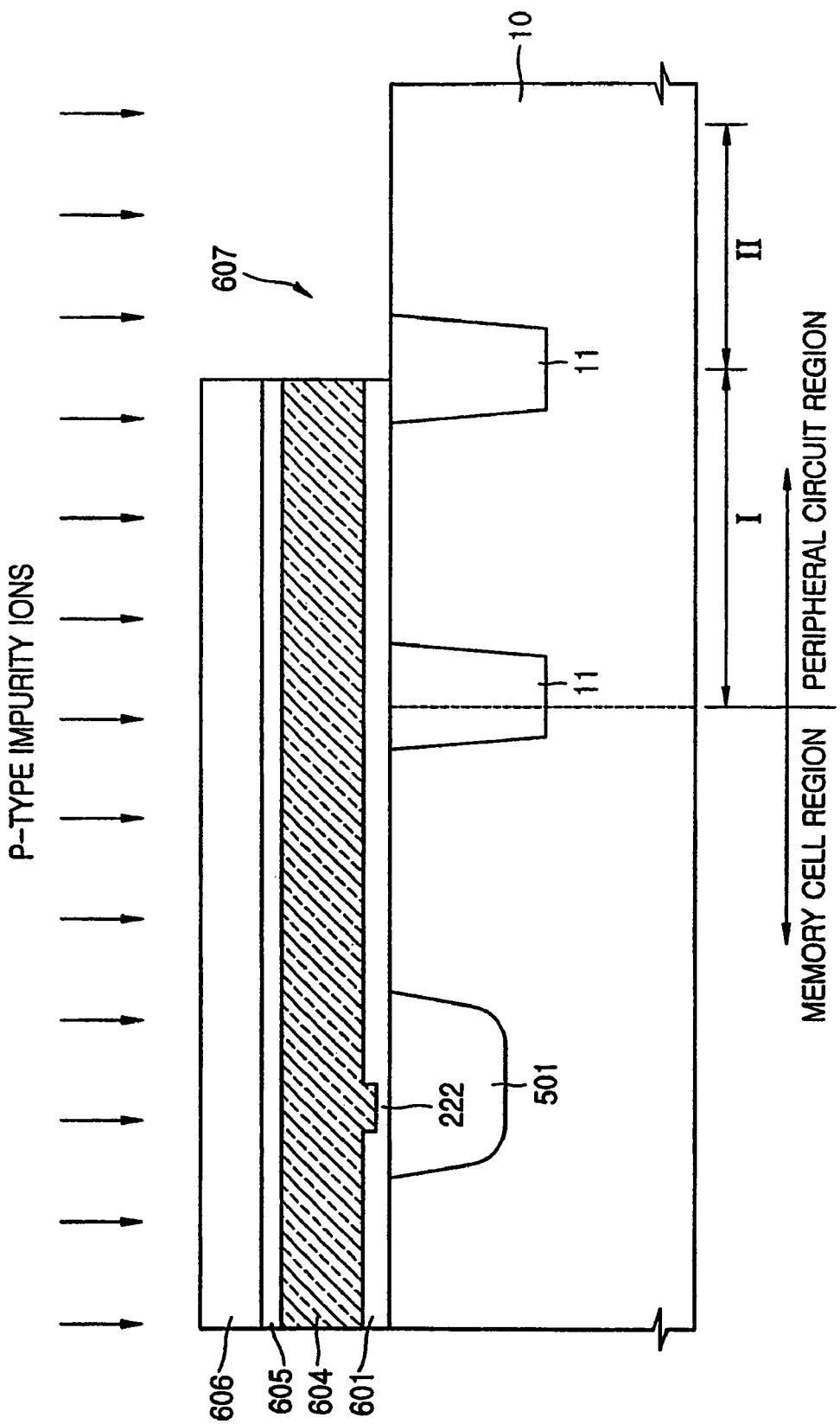

Referring to FIG. 12, a mask layer pattern 606, such as a photoresist layer pattern, is formed on the inter-gate insulating layer 605. This mask layer pattern 606 has an opening 607, which exposes a portion of the second region II in the peripheral circuit region, i.e., a region where the low-voltage n-type MOS transistor will be formed. A wet etching process is performed using the mask layer pattern 606 as an etch mask, thereby removing the first insulating layer 601 from the exposed portion of the second region II. Thus, a portion of the surface of the semiconductor substrate 10 is exposed in the second region II. In this state, p-type impurity ions for controlling threshold voltage are implanted with an energy of approximately 30 KeV and a dose of $1\times10^{12}$ to $5\times10^{12}$ ions/cm$^2$. After this ion implantation process is finished, the mask layer pattern 606 is removed.

Figure 13:
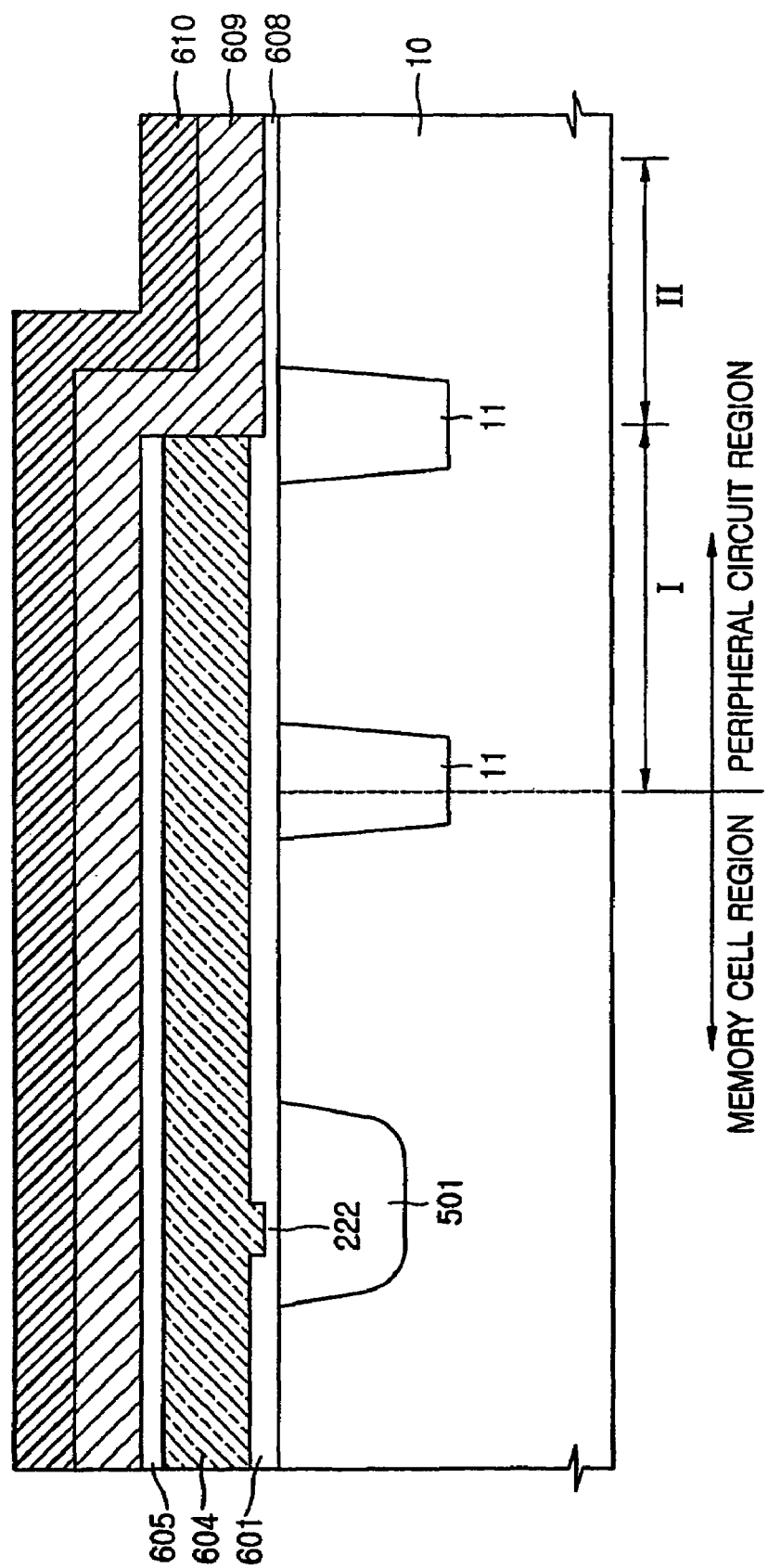

Referring to FIG. 13, a second insulating layer 608 is formed on the exposed surface of the second region II. The second insulating layer 608 serves as a gate insulating layer of the low-voltage n-type MOS transistor and is formed of silicon oxide to a thickness of approximately 20 to 40 Å. Thereafter, a second conductive layer 609 is formed on the entire surface of the resultant structure. The second conductive layer 609 is formed of polysilicon to a thickness of approximately 1500 Å. On top of the second conductive layer 609, a silicide layer 610 is formed to a thickness of approximately 1000 Å using a typical silicidation process.

Figure 14:
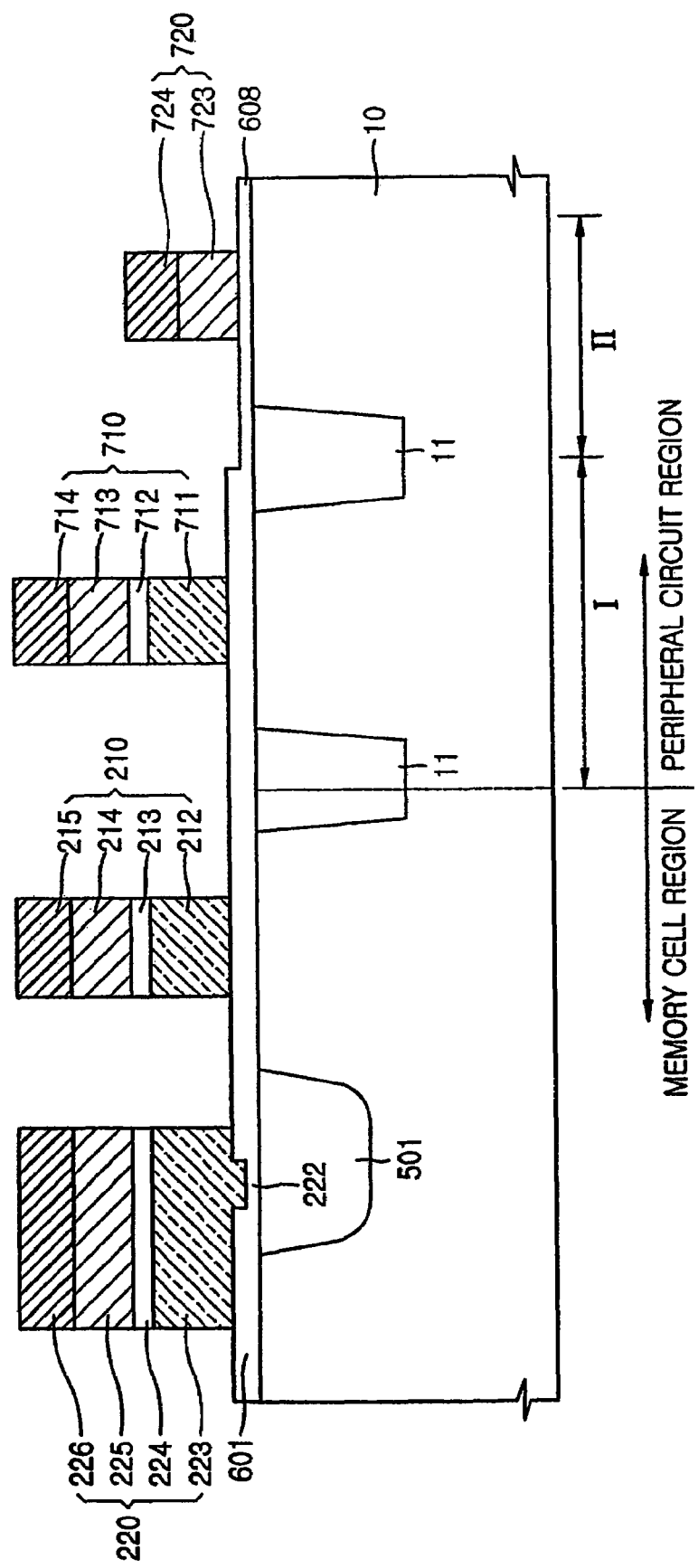

Referring to FIG. 14, a patterning process is performed using a predetermined mask layer pattern. Thus, a gate stack 210 of a select transistor and a gate stack 220 of a memory transistor are formed in the memory cell region, and a gate stack 710 of the high-voltage n-type MOS transistor and a gate stack 720 of the low-voltage n-type MOS transistor are formed in the peripheral circuit region. The patterning process may be performed only once. However, since the height of the gate stacks 210 and 220 of the memory cell region and the gate stack 710 of the high-voltage n-type MOS transistor is different from the height of the gate stack 720 of the low-voltage n-type MOS transistor, it is preferable to employ two separate patterning processes.

The gate stack 210 of the select transistor in the memory cell region includes a third conductive layer pattern 212, an inter-gate insulating layer pattern 213, a second conductive layer pattern 214, and a silicide layer pattern 215, which are sequentially stacked. The gate stack 220 of the memory transistor in the memory cell region includes a first conductive layer pattern 223, an inter-gate insulating layer pattern 224, a fourth conductive layer pattern 225, and a silicide layer pattern 226, which are sequentially stacked. The gate stack 710 of the high-voltage n-type MOS transistor in the first region I of the peripheral circuit region includes a first conductive layer pattern 711, an inter-gate insulating layer pattern 712, a second conductive layer pattern 713, and a silicide layer pattern 714, which are sequentially stacked. Also, the gate stack 720 of the low-voltage n-type MOS transistor in the second region II of the peripheral circuit region includes a second conductive layer pattern 723 and a silicide layer pattern 724 which are sequentially stacked.

Figure 15:
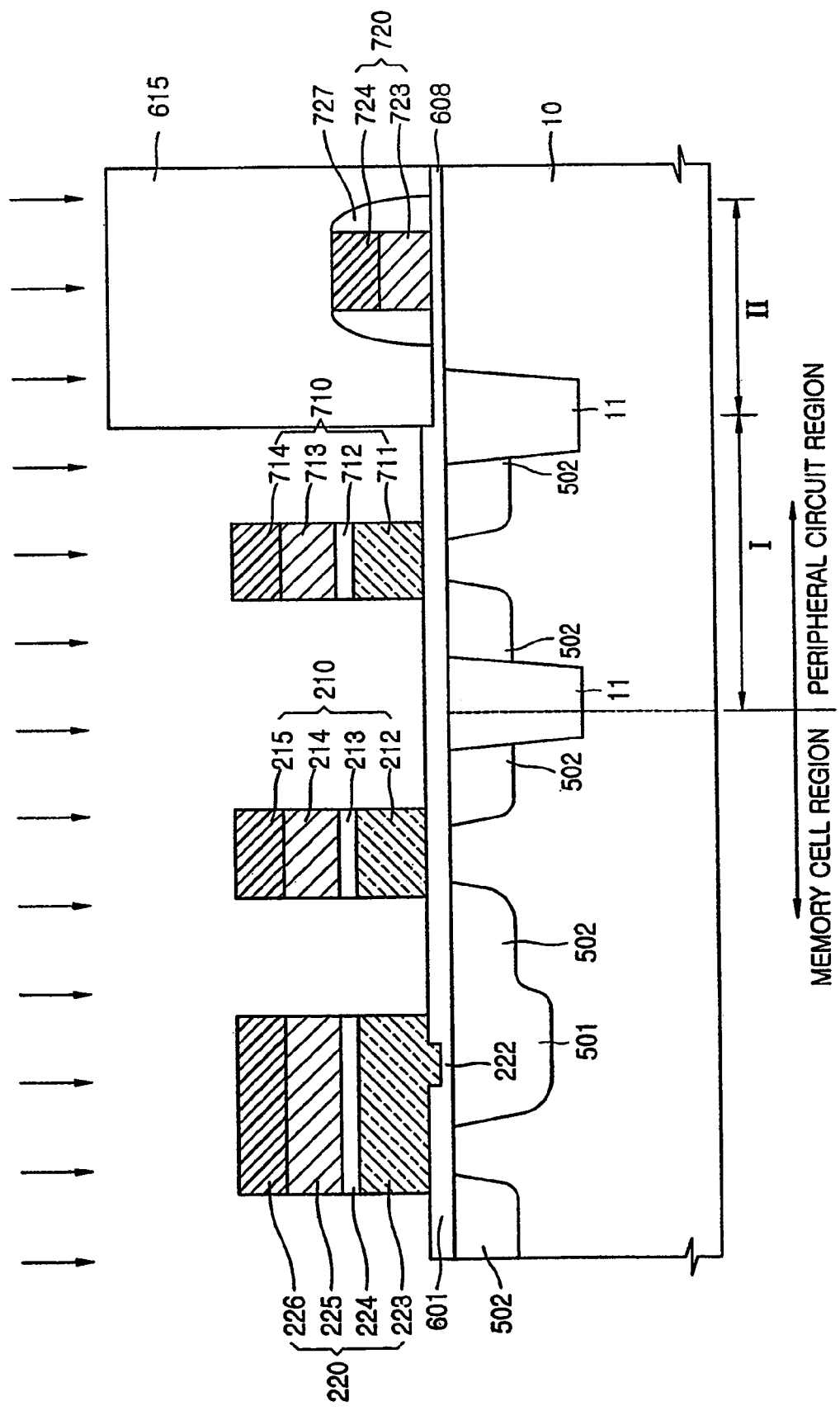

Referring to FIG. 15, a mask layer pattern 615, such as a photoresist layer pattern, is formed to cover only the second region II of the peripheral circuit region and expose other regions, i.e., the memory cell region and the first region I of the peripheral circuit region. By using the mask layer pattern 615, the gate stack 210 of the select transistor, the gate stack 220 of the memory transistor, and the gate stack 710 of the high-voltage n-type MOS transistor as an ion implantation mask, n-type impurity ions are implanted into the semiconductor substrate 10. Phosphorus ions are used as the impurity ions and are implanted with an energy of approximately 90 KeV and a dose of $5\times10^{12}$ to $9\times10^{12}$ ions/cm$^2$. Thus, first impurity regions 502 are formed adjacent to the gate stacks 210, 220, and 710 in the semiconductor substrate 10. In particular, a first impurity region 502 disposed between the gate stack 210 of the select transistor and the gate stack 220 of the memory transistor is connected to the deep impurity region 501. After the ion implantation process is finished, the mask layer pattern 615 is removed.

Referring to FIG. 16B, a mask layer pattern 616, such as a photoresist layer pattern, is formed. The mask layer pattern 616 includes a first opening 617a, which exposes a common source region of the memory cell region, and a second opening 617b, which exposes the low-voltage n-type MOS transistor of the peripheral circuit region. This mask layer pattern 616 is used as an ion implantation mask during two following ion implantation processes.

Firstly, as shown in FIG. 16A, to form a fourth impurity region 505, p-type impurity ions are implanted into the substrate 10. This p-type ion implantation is performed to restrict the diffusion of n-type impurity ions to a certain width. Thus, the p-type impurity ions are obliquely implanted at a certain angle of, for example, 20 to 40°. Here, boron ions are used as the p-type impurity ions and are implanted with an energy of approximately 30 KeV and a dose of $1\times10^{12}$ to $5\times10^{12}$ ions/cm$^2$. The angle of implantation is not specifically limited, but it is preferable to perform an oblique ion implantation process in all symmetrical directions.

Secondly, as shown in FIG. 16B, n-type impurity ions are implanted into the semiconductor substrate 10. Arsenic ions are used as the n-type impurity ions and are implanted with an energy of approximately 30 KeV and a dose of $1\times10^{12}$ to $5\times10^{12}$ ions/cm$^2$. Thus, second impurity regions 503 are formed in the common source region of the memory cell region and the source/drain regions of the low-voltage n-type MOS transistor. In particular, a second impurity region 503 formed in the common source region of the memory cell is disposed within the first impurity region 502. After the second impurity regions 503 are formed, the mask layer pattern 616 is removed.

Figure 17:
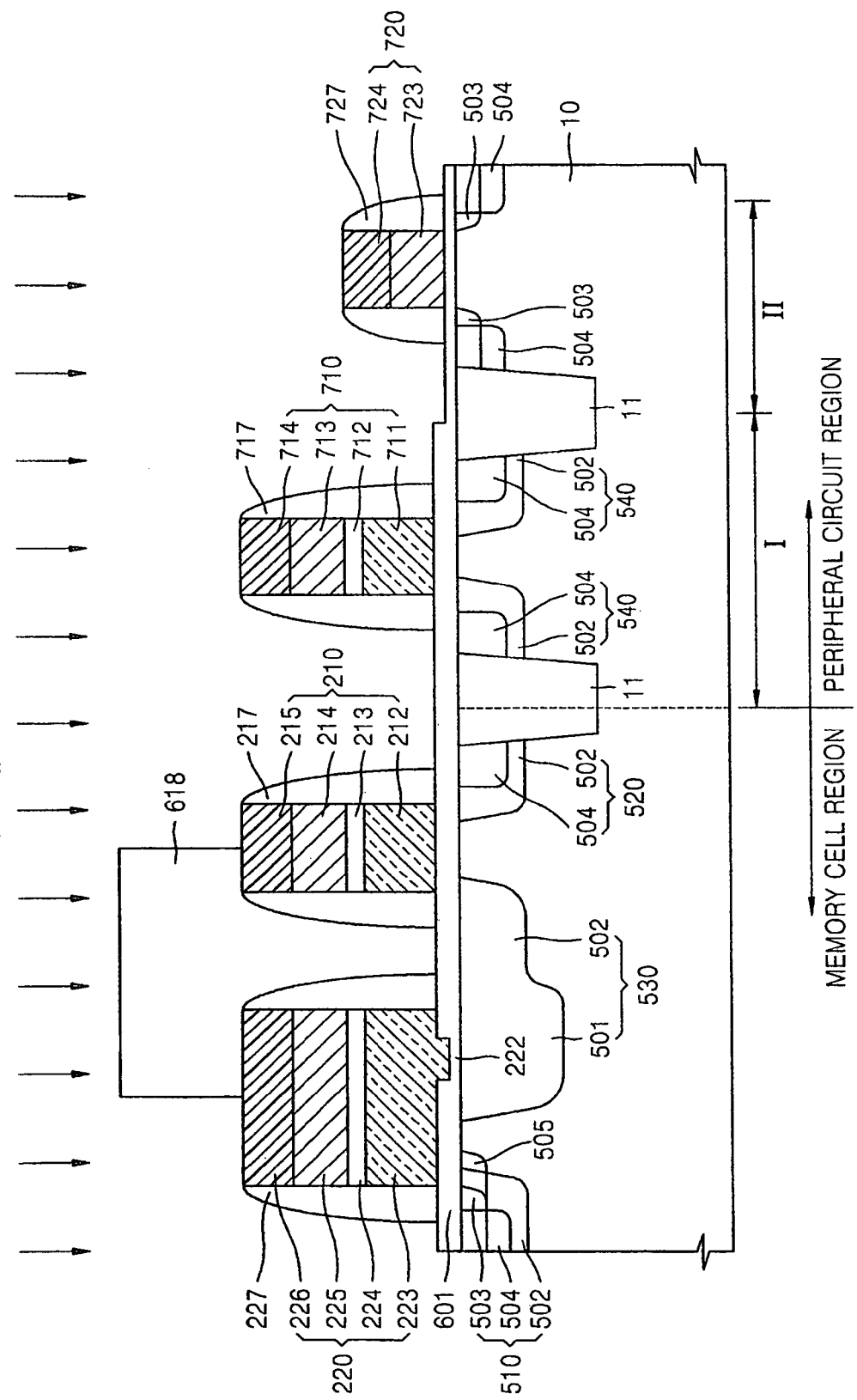

Referring to FIG. 17, a typical spacer forming process is carried out. Thus, gate spacers 217, 227, 717, and 727 are formed on sidewalls of the gate stacks 210, 220, 710, and 720, respectively. Next, a mask layer pattern 618, such as a photoresist layer pattern, is formed. This mask layer pattern 618 exposes the common source region and the drain region of the memory cell region, the source/drain regions of the high-voltage n-type MOS transistor, and the source/drain regions of the low-voltage n-type MOS transistor. Using this mask layer pattern 618 as an ion implantation mask, n-type impurity ions are implanted into the semiconductor substrate 10. Arsenic ions are used as the n-type impurity ions and are implanted with an energy of approximately 50 KeV and a dose of $1\times10^{15}$ to $5\times10^{15}$ ions/cm$^2$. Thus, third impurity regions 504 are formed in the common source region and the drain region of the memory cell region, the source/drain regions of the high-voltage n-type MOS transistor, and the source/drain regions of the low-voltage n-type MOS transistor. After the third impurity regions 504 are formed, the mask layer pattern 618 is removed.

A third impurity region 504 in the common source region of the memory cell region is formed within the first and second impurity region 502 and 503. Here, the third impurity region 504 is formed to be shallower than the first impurity region 502 and deeper than the second impurity region 503 and has a higher dopant concentration than the first and second impurity regions 502 and 503. A third impurity region 504 in the source/drain region of the high-voltage n-type MOS transistor is formed within the first impurity region 502. In addition, a third impurity region 504 of the high-voltage n-type MOS transistor is surrounded by the second impurity region 503 but formed to be deeper than the second impurity region 503.

Thereafter, although not shown in the figures, a typical metallization process is performed to form metal interconnections, thereby completing the EEPROM device.

As described herein, in the EEPROM cell and the EEPROM device according to the present invention, a plurality of EEPROM devices have a single common source region. The common source region, which is electrically connected to a source electrode by a common source contact, includes both an LDD structure and a DDD structure. Above all, an impurity region of the LDD structure, which is used as a path via which carriers such as electrons flow, is formed with a higher dopant concentration than an impurity region of the outermost DDD structure, so that the source resistance of the common source region can be reduced. As a result, the electrical characteristics of the EEPROM device can improve, and the integration density of the device can be still enhanced using the DDD structure.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an EEPROM cell, the method comprising:

preparing a semiconductor substrate that has a first region in which a first EEPROM device will be formed, a second region in which a second EEPROM device will be formed, and a common source region disposed between the first region and the second region;

forming a first gate stack for a first select transistor and a second gate stack for a first memory transistor in the first region of the semiconductor substrate and forming a third gate stack for a second select transistor and a fourth gate stack for a second memory transistor in the second region of the semiconductor substrate;

forming first impurity regions with a first dopant concentration respectively in a drain region and a floating region of the first region, in a drain region and a floating region of the second region, and in the common source region by performing a first ion implantation process on the semiconductor substrate on which the first, second, third, and fourth gate stacks are formed;

forming second impurity regions with a second dopant concentration respectively in the first impurity regions of the common source region by performing a second ion implantation process on the semiconductor substrate in which the first impurity regions are formed, wherein the second dopant concentration is higher than the first dopant concentration; and forming third impurity regions with a third dopant concentration respectively in the drain region of the first region, in the drain region of the second region, and in the common source region by performing a third ion implantation process on the semiconductor substrate in which the first and second impurity regions are formed, wherein in the common source region, the third impurity region is surrounded by the second impurity region in a horizontal direction but formed to have a greater junction depth than the second impurity region.

2. The method of claim 1, wherein the second gate stack for the first memory transistor and the fourth gate stack for the second memory transistor are separated from each other by the common source region.

3. The method of claim 1, wherein the first ion implantation process is performed with a higher energy than the third ion implantation process, and the third ion implantation process is performed with a higher energy than the second ion implantation process.

4. The method of claim 1, wherein forming the second impurity regions comprises:
   forming a mask layer pattern, which includes openings that expose portions of the common source region;
   implanting impurity ions with the second dopant concentration into the common source region by performing the second ion implantation process using the mask layer pattern as an ion implantation mask; and
   removing the mask layer pattern.

5. The method of claim 4, further comprising, before implanting the impurity ions, obliquely implanting impurity ions of an opposite conductivity type toward outer portions of the openings using the mask layer pattern as an ion implantation mask.

6. The method of claim 1, wherein forming the third impurity regions comprises:
   forming a mask layer pattern, which includes openings that expose the drain region of the first region, the common source region, and the drain region of the second region;
   implanting impurity ions with the third dopant concentration into the drain region of the first region, the common source region, and the drain region of the second region by performing the third ion implantation process using the mask layer pattern as an ion implantation mask; and
   removing the mask layer pattern.

7. The method of claim 1, wherein the first impurity regions are formed with approximately $5 \times 10^{12}$ to $9 \times 10^{12}$ ions/cm$^2$, the second impurity regions are formed with approximately $1 \times 10^{14}$ to $8 \times 10^{14}$ ions/cm$^2$, and the third impurity regions are formed with approximately $1 \times 10^{15}$ to $5 \times 10^{15}$ ions/cm$^2$.

8. The method of claim 1, further comprising, before performing the second ion implantation process, implanting impurity ions of an opposite conductivity type to the conductivity type of the first impurity regions.

9. A method of manufacturing an EEPROM device, the method comprising:
   preparing a semiconductor substrate including a memory cell region, which has at least two EEPROM devices and a common source region disposed between the EEPROM devices, and a peripheral circuit region, which has a high-voltage MOS transistor and a low-voltage MOS transistor;
   forming a first gate stack for a select transistor and a second gate stack for a memory transistor in the memory cell region of the semiconductor substrate and forming a third gate stack for the high-voltage MOS transistor and a fourth gate stack for the low-voltage MOS transistor in the peripheral circuit region of the semiconductor substrate;
   forming first impurity regions with a first dopant concentration in a common source region, a floating region, and a drain region of the memory cell region and in source/drain regions of the high-voltage MOS transistor by performing a first ion implantation process on the semiconductor substrate on which the first, second, third, and fourth gate stacks are formed;
   forming second impurity regions with a second dopant concentration in the common source region of the memory cell region and in source/drain regions of the low-voltage MOS transistor by performing a second ion implantation process on the semiconductor substrate in which the first impurity regions are formed, wherein the second dopant concentration is higher than the first dopant concentration; and
   forming third impurity regions with a third dopant concentration in the common source region and the drain region of the memory cell, in the source/drain regions of the high-voltage MOS transistor, and in the source/drain regions of the low-voltage MOS transistor by performing a third ion implantation process on the semiconductor substrate in which the first and second impurity regions are formed.

10. The method of claim 9, wherein in the common source region, a third impurity region is surrounded by a second impurity region in a horizontal direction but formed to have a greater junction depth than the second impurity region.

11. The method of claim 9, wherein the second ion implantation process is performed using a mask layer pattern, which covers the floating region and the drain region of the memory cell region and the source/drain regions of the high-voltage MOS transistor and exposes the common source region of the memory cell region and the source/drain regions of the low-voltage MOS transistor, as an ion implantation mask.

12. The method of claim 9, wherein the third ion implantation process is performed using a mask layer pattern, which covers the floating region of the memory cell region and exposes the common source region and the drain region of the memory cell region, the source/drain regions of the high-voltage MOS transistor, and the source/drain regions of the low-voltage MOS transistor.

13. The method of claim 9, further comprising, before performing the second ion implantation process, implanting impurity ions of an opposite conductivity type to the conductivity type of the first impurity regions.

* * * * *